(12) United States Patent
Kim et al.

(10) Patent No.: US 7,790,494 B2
(45) Date of Patent: Sep. 7, 2010

(54) METHOD OF FABRICATING A MULTI-BIT ELECTRO-MECHANICAL MEMORY DEVICE

(75) Inventors: Min-Sang Kim, Seoul (KR);
Sung-Young Lee, Yongin-si (KR);
Sung-Min Kim, Incheon (KR);
Eun-Jung Yun, Seoul (KR); Dong-Won Kim, Seongnam-si (KR); Dong-Gun Park, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 185 days.

(21) Appl. No.: 12/007,819

(22) Filed: Jan. 16, 2008

(65) Prior Publication Data
US 2008/0185668 A1  Aug. 7, 2008

(30) Foreign Application Priority Data
Jan. 16, 2007  (KR) ............... 10-2007-0004672

(51) Int. Cl.
*H01L 21/00* (2006.01)
*H01L 35/24* (2006.01)
*H01L 51/00* (2006.01)
*H01L 29/792* (2006.01)

(52) U.S. Cl. .............. 438/52; 438/50; 257/40; 257/415; 365/185.03; 365/185.12

(58) Field of Classification Search ............ 438/52
See application file for complete search history.

(56) References Cited
U.S. PATENT DOCUMENTS
6,548,841 B2   4/2003 Frazier et al.

| 6,611,033 B2 | 8/2003 | Hsu et al. |
| 6,621,392 B1 | 9/2003 | Volant et al. |
| 6,911,682 B2 | 6/2005 | Rueckes et al. |
| 6,924,538 B2 | 8/2005 | Jaiprakash et al. |
| 7,045,843 B2 | 5/2006 | Goto et al. |

(Continued)

OTHER PUBLICATIONS

Choi et al. in Compact Nano-Electro-Mechanical Non-Volatile Memory (3D Integration), Dec. 10-12, 2007, Electron Devices Meeting, 2007, IEDM 2007, IEEE International, pp. 603-606.*

*Primary Examiner*—N Drew Richards
*Assistant Examiner*—Michael Jung
(74) *Attorney, Agent, or Firm*—Harness, Dickey & Pierce, P.L.C.

(57) ABSTRACT

A memory device may include a substrate, a bit line, at least a first lower word line, at least a first trap site, a pad electrode, at least a first cantilever electrode, and/or at least a first upper word line. The bit line may be formed on the substrate in a first direction. The first lower word line and the first trap site may be insulated from the bit line and formed in a second direction crossing the bit line. The pad electrode may be insulated at sidewalls of the first lower word line and the first trap site and connected to the bit line. The first cantilever electrode may be formed in the first direction, connected to the pad electrode, floated on the first trap site with at least a first lower vacant space, and/or configured to be bent in a third direction. The first upper word line may be formed on the first cantilever electrode in the second direction with at least a first upper vacant space.

9 Claims, 18 Drawing Sheets

U.S. PATENT DOCUMENTS

| | | | |
|---|---|---|---|
| 7,056,758 B2 * | 6/2006 | Segal et al. | 438/50 |
| 7,289,357 B2 * | 10/2007 | Bertin et al. | 365/166 |
| 7,573,739 B2 * | 8/2009 | Yun et al. | 365/185.03 |
| 2007/0132046 A1 * | 6/2007 | Yoo et al. | 257/415 |
| 2008/0049491 A1 * | 2/2008 | Park | 365/164 |
| 2008/0185271 A1 * | 8/2008 | Valenzuela et al. | 200/181 |
| 2009/0053846 A1 * | 2/2009 | Rueckes et al. | 438/50 |

\* cited by examiner

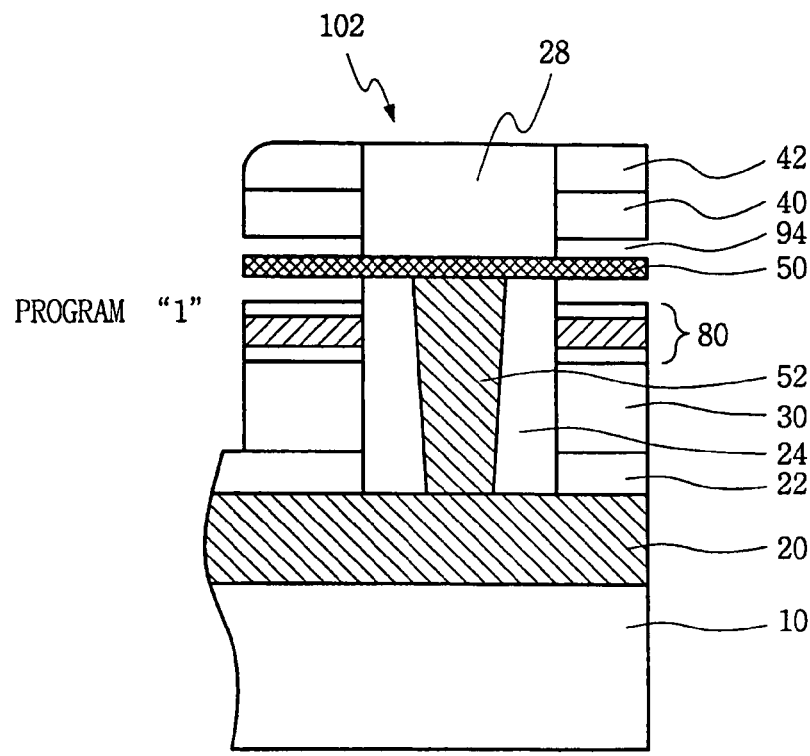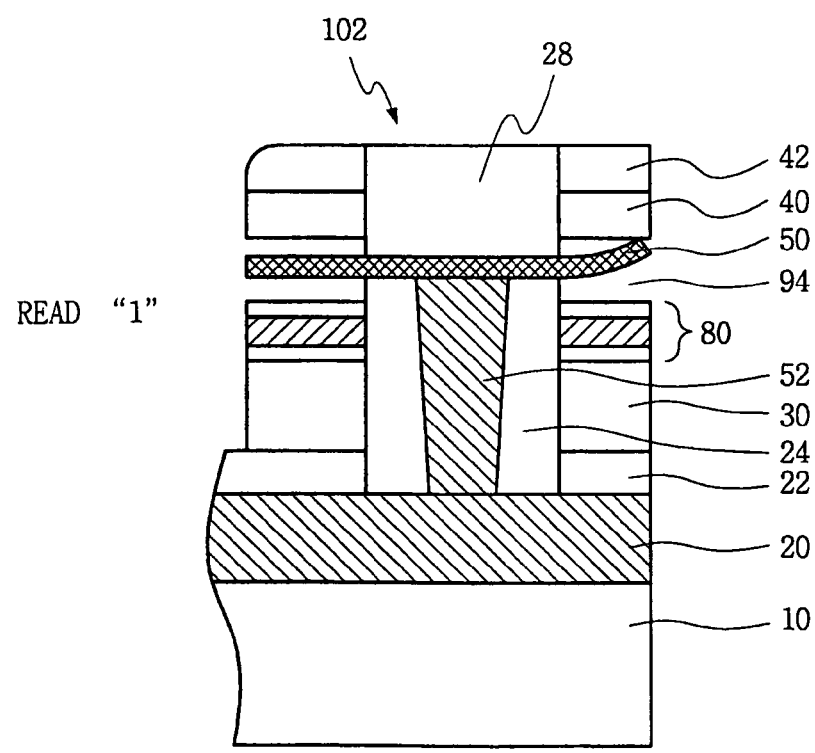

METHOD OF FABRICATING A MULTI-BIT ELECTRO-MECHANICAL MEMORY DEVICE

PRIORITY STATEMENT

This application claims the benefit of priority to Korean Patent Application No. 10-2007-0004672, filed Jan. 16, 2007.

BACKGROUND

1. Field

Example embodiments relate to a memory device, a method of fabricating the same, and/or an operation method thereof, and for example, to a multi-bit electro-mechanical memory device in which desired, or alternatively, predetermined data are written and/or read by a switching operation of a plurality of cantilever electrodes formed symmetrically to each other centering a trench, a method of fabricating the same, and/or an operation method thereof.

2. Description of Related Art

Memory devices used for storing data may be classified as volatile memory devices and non-volatile memory devices. Examples of conventional volatile memory devices include a dynamic random access memory (DRAM) and a static random access memory (SRAM). A volatile memory device is faster in an operation speed of inputting/outputting data, but loses stored data if the power supply is discontinued. Examples of conventional non-volatile semiconductor memory devices include an erasable programmable read only memory (EPROM) and an electrically erasable programmable read only memory (EEPROM). A non-volatile semiconductor memory device is slower in the operation speed of inputting/outputting data, but maintains stored data even if the power supply is discontinued.

A conventional memory device has been fabricated by applying a metal oxide semiconductor field effect transistor (MOSFET) based on a metal oxide semiconductor (MOS) technique. For example, a memory device of a stack gate type transistor and a memory device of a trench gate type transistor have been developed. The memory device of a stack gate type transistor has a structure stacked on a semiconductor substrate composed of silicon material. The memory device of the trench gate type transistor has a structure embedded inside the semiconductor substrate. However, to reduce a short channel effect in the MOSFET, the width and length of a channel need to be a desired, or alternatively, a predetermined amount or more, and the thickness of a gate insulating layer, which is formed between a gate electrode positioned at an upper end of the channel and a semiconductor substrate, needs to be thinner. Accordingly, the MOSFET has more difficulty in realizing a memory device in a nanoscaled ultra-micro structure.

Research has been conducted to develop a memory device having a structure which is configured to substitute for the MOSFET Examples of cutting edge techniques include a micro electro-mechanical system (MEMS) technique applied to a suspend bridge memory (SBM), and a nano electro-mechanical system (NEMS) technique.

FIG. 1 is a sectional view schematically illustrating a conventional memory device.

As illustrated in FIG. 1, in a conventional memory device, a field effect transistor (FET) sensing part 221, a pull-in electrode part 223, and a cantilever electrode support part 225 are formed so as to be distinguished from one another on a shallow trench isolation (STI) layer 224 on a substrate 222. A cantilever electrode 240 having one side being supported by and electrically connected to the cantilever electrode support part 225, is formed to be spaced apart from the pull-in electrode part 223 and the FET sensing part 221 at a desired, or alternatively, a predetermined height. The cantilever electrode 240 is formed to be bent in a direction of a pull-in electrode 232 by an electric field induced in the pull-in electrode part 223. Even though the electric field induced in the pull-in electrode part 223 is removed, the cantilever electrode 240 is maintained in the bent position by the electric field induced from electrons captured in a polysilicon gate electrode 230. For example, the polysilicon gate electrode 230 corresponds to a floating electrode of a flash memory device which captures electrons tunneled through a tunnel oxide layer composed of a dielectric and formed on a source-drain region 227 of the FET sensing part 221. The pull-in electrode part 223 and the cantilever electrode support part 225 are composed of the same polysilicon material as the polysilicon gate electrode 230. The cantilever electrode 240 is composed of the polysilicon material in the cantilever electrode support part 225.

Therefore, the conventional memory device realizes the non-volatile memory device with the pull-in electrode 232 which bends the cantilever electrode 240 by an electrostatic force under the cantilever electrode 240 floating at the desired, or alternatively, the predetermined height, and the FET sensing part 221 formed to maintain the cantilever electrode 240 in the bent position.

However, in the conventional memory device, the cantilever electrode 240 formed in a direction crossing the FET sensing part 221 is disconnected at sections. Because the cantilever electrode support part 225 supporting the cantilever electrode 240 is formed to be parallel to the FET sensing part 221 on the same line, it is more difficult to configure a cell array in a matrix shape. Therefore, the integration density of the memory device decreases.

In the conventional memory device, the pull-in electrode part 223, which bends the cantilever electrode 240 from a horizontal level, and the FET sensing part 221, which maintains the cantilever electrode 240 bent by the pull-in electrode part 223 in the bent position so as to be continuously bent, need to be individually configured on the same plane level. The cantilever electrode 240 needs to be formed longer to cover the top of the pull-in electrode part 223, and FET sensing part 221. Therefore, the integration density of the memory device decreases.

The conventional memory device is formed to program/write or read only the 1-bit data per unit cell comprising the cantilever electrode 240, the pull-in electrode 232 and the FET sensing part 221. Therefore, it is more difficult for the conventional memory device to store multi-bit data.

SUMMARY

Example embodiments may provide a multi-bit electro-mechanical memory device, a method of fabricating the same, and/or an operation method thereof, in which a cantilever electrode and a bit line for applying a charge to the cantilever electrode are formed to have the same direction and/or to configure a matrix-shaped cell array, so that the integration density of the memory device may be substantially increased.

Example embodiments may provide a multi-bit electro-mechanical memory device, a method of fabricating the same, and/or an operation method thereof, in which a pull-in electrode part and a FET sensing part which contact with a cantilever electrode are unified, so that the integration density of the memory device may be substantially increased.

Example embodiments may provide a multi-bit electromechanical memory device and/or a method of fabricating the same, in which 2-bit or more data per unit cell are input/output.

According to an example embodiment, a memory device may include a substrate, a bit line, at least a first lower word line, at least a first trap site, a pad electrode, at least a first cantilever electrode, and/or at least a first upper world line. The bit line may be on the substrate in a first direction. The first lower word line and the first trap site may be insulated from the bit line and in a second direction crossing the bit line. The pad electrode may be insulated at sidewalls of the first lower word line and the first trap site and connected to the bit line. The first cantilever electrode may be in the first direction, connected to the pad electrode, floated on the first trap site with at least a first lower vacant space, and configured to be bent in a third direction. The first upper word line may be on the first cantilever electrode in the second direction with at least a first upper vacant space.

According to an example embodiment, the memory device may include a second lower word line, a second trap site, a second cantilever electrode, a third interlayer insulating layer, and/or a second upper word line. The second lower word line and the second trap site may be insulated from the bit line and in the second direction crossing the bit line. The first lower word line and first trap site may be separated from the second lower word line and second trap site by a trench in the second direction. Each of the first lower word line and first trap site and the second lower word line and second trap site may be insulated from the bit line by a first interlayer insulating layer. The pad electrode may be insulated from the first and second lower word lines and the first and second trap sites by a second interlayer insulating layer to fill sidewalls of the first and second lower word lines opposite to the trench and sidewalls of the first and second trap sites opposite to the trench. The pad electrode may be in a contact hole in the second interlayer insulating layer at both sides of the first and second lower word lines and the first and second trap sites opposite to each other. The contact hole may expose the bit line through the second interlayer insulating layer. The second cantilever electrode may be in the first direction and configured to be bent in the third direction. The first and second cantilever electrodes may be supported on the pad electrode by the second interlayer insulating layer. The second cantilever electrode may be floated with a second lower vacant space on the second trap site. The first and second cantilever electrodes may be divided by the trench. The third interlayer insulating layer may be on the first and second cantilever electrodes corresponding to the pad electrode. The second upper word line may be on the second cantilever electrode in the second direction with a second upper vacant space. The first and second upper word lines may be supported by the third interlayer insulating layer.

According to an example embodiment, a method of fabricating a memory device may include forming a bit line on a substrate in a first direction. A stack including a first interlayer insulating layer, a lower word line, a trap site, and a first sacrificial layer may be in a second direction crossing the bit line. A second interlayer insulating layer including a contact hole may be formed to fill sidewalls of the stack and the contact hole may expose the bit line at the sidewalls of the stack. A pad electrode may be formed inside the contact hole. A cantilever electrode may be formed on the pad electrode and the second interlayer insulating layer in the first direction to be connected to the top of the first sacrificial layer. A second sacrificial layer and an upper word line may be formed on the cantilever electrode and the second interlayer insulating layer formed on the stack in the second direction. A third interlayer insulating layer is formed around sidewalls of the second sacrificial layer and the upper word line. A trench may be formed to expose the first interlayer insulating layer at the bottom by removing the upper word line, the second sacrificial layer, the cantilever electrode, the first sacrificial layer, the trap site, and the lower word line in the second direction. A space may be formed above and under the cantilever electrode by removing the first sacrificial layer and the second sacrificial layer exposed by the trench.

BRIEF DESCRIPTION OF THE DRAWINGS

The above and/or other aspects and advantages will become more apparent and more readily appreciated from the following detailed description of example embodiments taken in conjunction with the accompanying drawings of which:

FIGS. 5A, 5B, 6A and 6B are sectional views for explaining an operation of programming/writing and/or reading data by a multi-bit electro-mechanical memory device according to an example embodiment;

DETAILED DESCRIPTION OF EXAMPLE EMBODIMENTS

Figure 1:
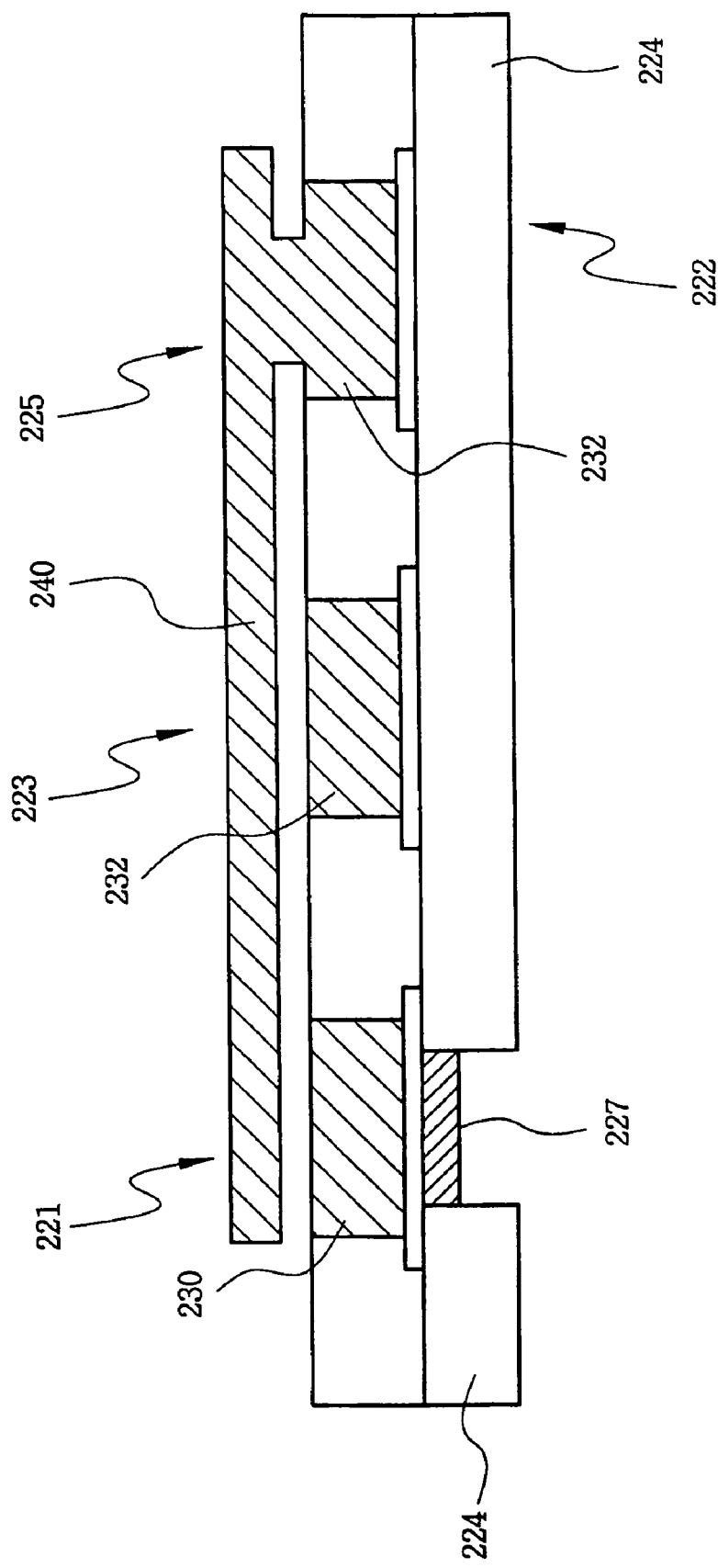
FIG. 1 is a sectional view schematically illustrating a conventional memory device.

Example embodiments will now be described more fully hereinafter with reference to the accompanying drawings. Embodiments may, however, be in many different forms and should not be construed as being limited to example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout.

Figure 2:
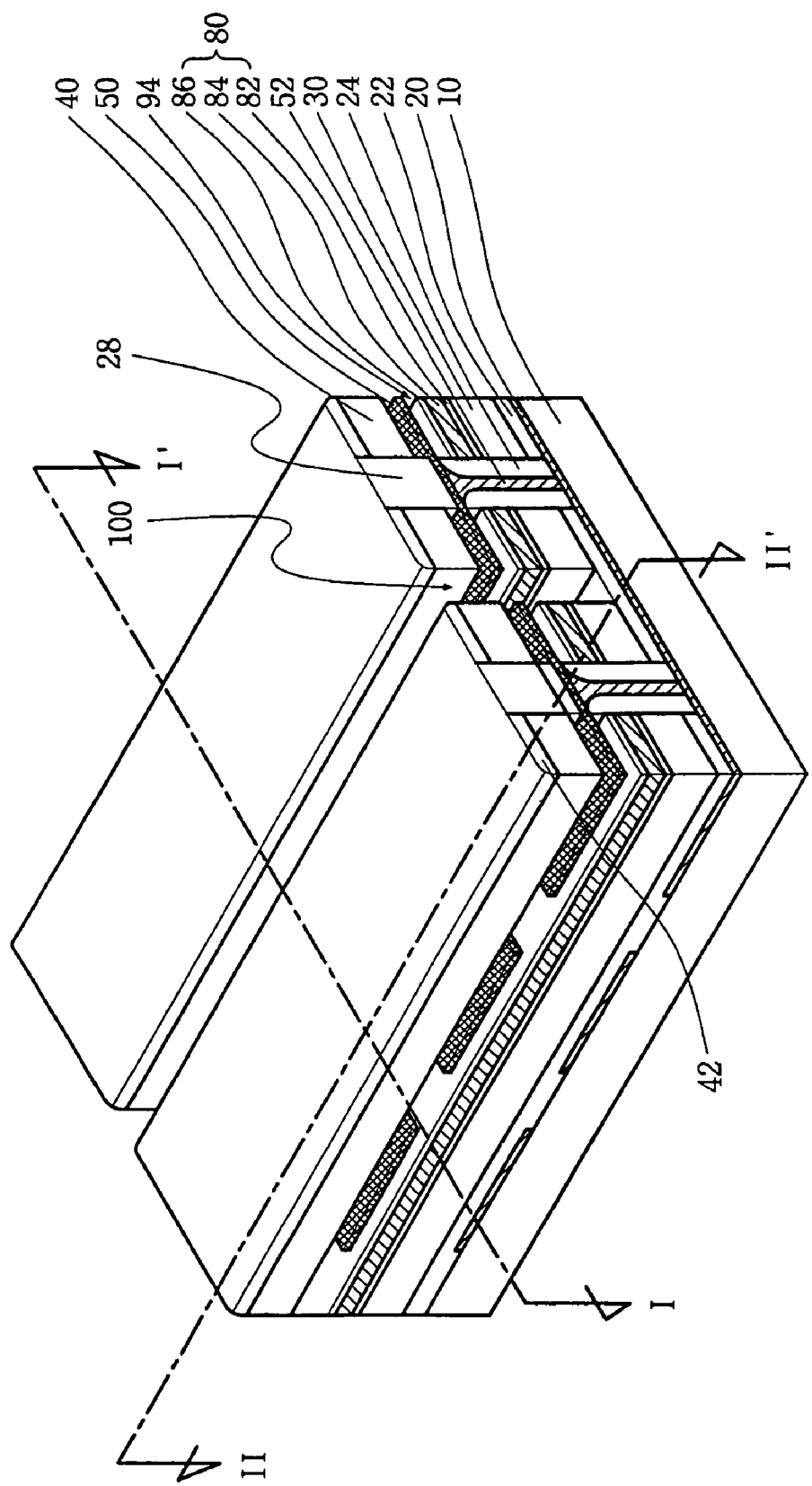
FIG. 2 is a perspective view of a multi-bit electro-mechanical memory device according to an example embodiment.
Figure 3:
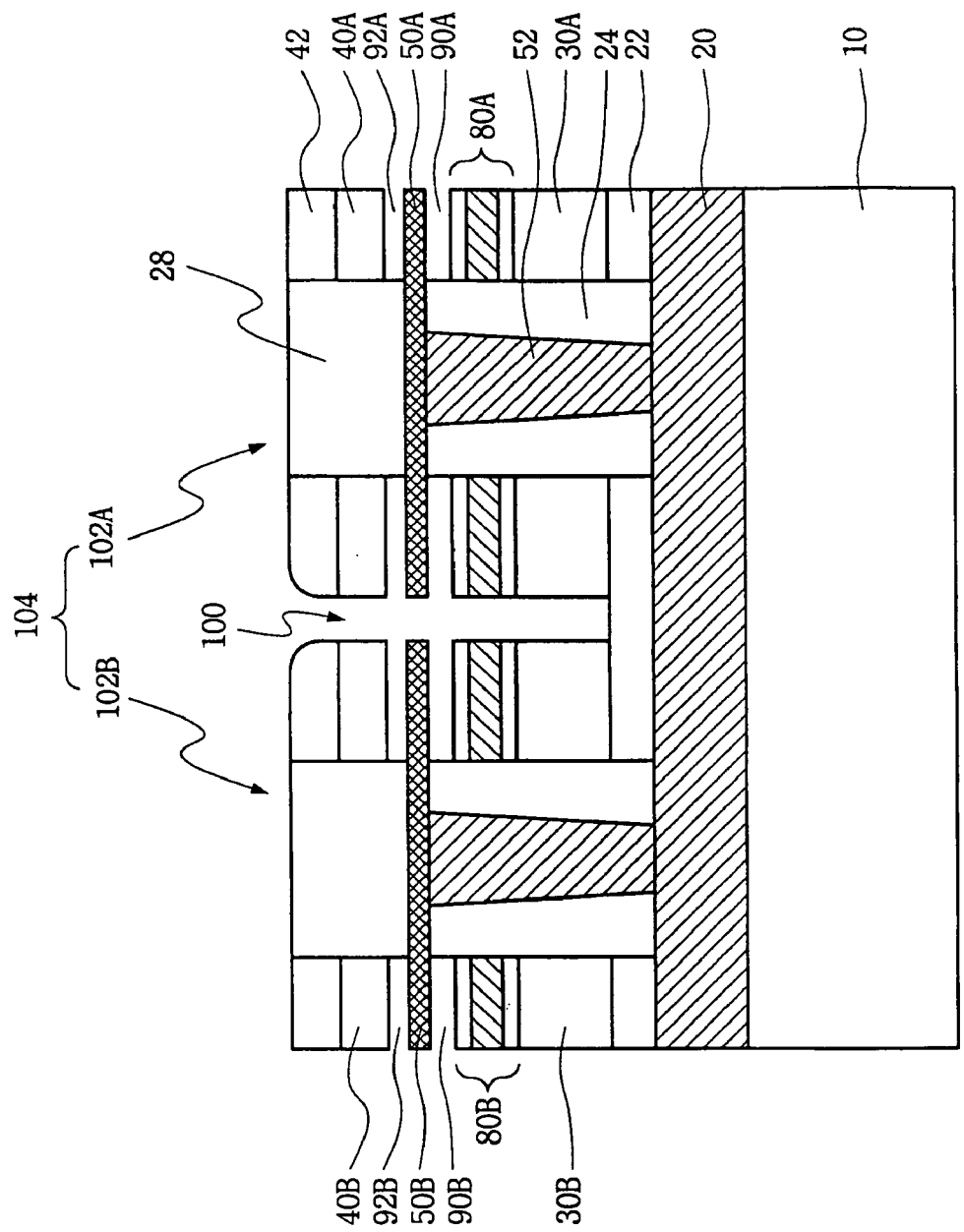
FIG. 3 is a sectional view taken along Line I-I' of FIG. 2.

FIG. 2 is a perspective view of a multi-bit electro-mechanical memory device according to an example embodiment, and FIG. 3 is a sectional view taken along Line I-I' of FIG. 2.

As illustrated in FIGS. 2 and 3, a plurality of bit lines 20 may be formed on a substrate 10 with a desired, or alternatively, a predetermined flat surface in a first direction. For example, the substrate 10 may include an insulating substrate or semiconductor substrate having higher flexibility. The bit lines 20 may include at least one of higher conductive metal materials, for example gold, silver, copper, aluminum, tungsten, tungsten silicide, titanium, nitride titanium, tantalum and tantalum silicide, and crystalline silicon and polysilicon materials which are doped with conductive impurities. A first interlayer insulating layer 22 may be formed on the bit lines 20. For example, the first interlayer insulating layer 22 may be a dielectric for electrically insulating the bit lines 20, and/or may include a silicon oxide layer or a silicon oxynitride layer.

A first lower word line 30A and a second lower word line 30B, which may be separated from each other by a trench 100 and parallel to each other, and/or a first trap site 80A and a second trap site 80B, which may be separated from each other by the trench 100 and parallel to each other, may be formed on the first interlayer insulating layer 22. For example, the first lower word line 30A and the second lower word line 30B may be referred to as a lower word line 30, and/or the first trap site 80A and the second trap site 80B may be referred to as a trap site 80. Because the first and second lower word lines 30A and 30B may be insulated from the substrate 10 and/or the bit lines 20 by the first interlayer insulating layer 22, an electrical signal from the bit lines 20 may be more freely applied to the first and second word lines 30A and 30B. The first and second lower word lines 30A and 30B may include higher conductive metal materials, for example gold, silver, copper, aluminum, tungsten, tungsten silicide, titanium, nitride titanium, tantalum and/or tantalum silicide. The first and second trap sites 80A and 80B may tunnel a desired, or alternatively, a predetermined thinner film, to trap a charge in a desired, or alternatively, a predetermined quantity or above. The charge may be applied through the first and second lower word lines 30A and 30B, inside the desired, or alternatively, the predetermined thinner film. The first and second trap sites 80A and 80B may be formed to continuously restrict (e.g., bind) the trap charge if no charge is supplied from the outside. For example, the first and second trap sites 80A and 80B may include a thinner film in an oxide-nitride-oxide (ONO) structure in which a first silicon oxide layer 82, a silicon nitride layer 84, and a second silicon oxide layer 86 may be formed on the first and second lower word lines 30A and 30B.

A second interlayer insulating layer 24 or a spacer (not shown) for electrically insulating the first lower word line 30A from the second lower word line 30B and/or the first trap site 80A from the second trap site 80B may be formed, in a second direction, on outer sidewalls opposite to inner sidewalls of the first and second lower word lines 30A and 30B and/or the first and second trap sites 80A and 80B which are exposed by the trench 100. The second interlayer insulating layer 24 may be formed to be the same as, similar to, or higher than top surfaces of the first and second trap sites 80A and 80B in height, and/or to fill up the sidewalls of the first and second lower word lines 30A and 30B and the first and second trap sites 80A and 80B. The spacer may be selectively formed on the sidewalls of the first and second lower word lines 30A and 30B and/or the first and second trap sites 80A and 80B. Therefore, the second interlayer insulating layer 24 may be formed on the bit lines 20 and the substrate 10 exposed by the spacer, to more easily form a first cantilever electrode 50A and a second cantilever electrode 50B to be described later. For example, the second interlayer insulating layer 24 and/or the spacer may include a silicon nitride layer or a silicon oxynitride layer. The second interlayer insulating layer 24 and/or the spacer may be formed to protrude from the level of the top surfaces of the first and second trap sites 80A and 80B. At least a portion of the second interlayer insulating layer 24 and/or the spacer (not shown) may be removed to expose the bit lines 20 in the center between the outer sidewalls of the first lower word line 30A and first trap site 80A and the outer sidewalls of the second lower word line 30B and second trap site 80B, so that a contact hole 54 as illustrated in FIG. 11 may be formed. A pad electrode 52 electrically connected to the bit lines 20 may be formed inside the contact hole 54. The contact hole 54 may be formed by selectively removing the at least a portion of the second interlayer insulating layer 24 on the bit lines 20 at a portion of the second insulating layer 24 where the second interlayer insulating layer 24 and/or the spacer formed in the second direction crosses the bit lines 20 formed in the first direction. The first lower word line 30A may be insulated from the second lower word line 30B and/or the first trap site 80A may be insulated from the second trap site 80B by the second interlayer insulating layer 24 and/or the spacer. A height of the pad electrode 52 may be formed to be the same as or similar to the height of the second interlayer insulating layer 24 or the spacer. The pad electrode 52 may include at least of one higher conductive metal materials, for example gold, silver, copper, aluminum, tungsten, tungsten silicide, titanium, nitride titanium, tantalum and tantalum silicide, and crystalline silicon and polysilicon materials which are doped with conductive impurities.

The first and second cantilever electrodes 50A and 50B may be formed in the first direction (for example, an X-axial direction). The first and second cantilever electrodes 50A and 50B may each be floated, at first and second lower vacant spaces 90A and 90B, on the first and second trap sites 80A and 80B at either side of the pad electrode 52. The first and second cantilever electrodes 50A and 50B may be supported by the pad electrode 52, and/or the second interlayer insulating layer 24 or the spacer at both sides of the pad electrode 52. Therefore, in a multi-bit electro-mechanical memory device according to an example embodiment, the bit lines 20 may be formed in the first direction, the first and second word lines 30A and 30B may be formed on the bit lines 20 in the second direction crossing the bit lines 20, and/or the cantilever electrode 50 may be formed in the first direction such that a matrix-shaped cell array is configured to increase the integration density of the memory device. The first and second cantilever electrodes 50A and 50B may be bent towards the first and second trap sites 80A and 80B by an electrostatic force caused by an electric field induced in the first and second lower vacant spaces 90A and 90B. For example, if charges with different polarity in a desired, or alternatively, a predetermined quantity are applied between the first and second cantilever electrodes 50A and 50B and the first and second lower word lines 30A and 30B, the first and second cantilever electrodes 50A and 50B may be bent in a third direction (for example, a Z-axial direction) to be in contact with the first and second trap sites 80A and 80B by an electrostatic force corresponding to attraction. The charge applied to the first and second lower word lines 30A and 30B may be tunneled in the first and second trap sites 80A and 80B, to be captured therein. If the charges applied to the first and second lower word lines 30A and 30B and the first and second cantilever electrodes 50A and 50B are removed, the first and second cantilever electrodes 50A and 50B may be maintained in the bent position by the electric field induced by the charge captured in the first and second trap sites 80A and 80B. Because a charge of the opposite polarity to the charge captured in the first and second trap sites 80A and 80B may be induced at an end of the first and second cantilever electrodes 50A and 50B, the first and second cantilever electrodes 50A and 50B may be maintained in the bent position.

If the charges applied to the first and second lower word line 30A and 30B and the first and second cantilever electrodes 50A and 50B are removed, the first and second cantilever electrodes 50A and 50B may be maintained in the bent position by the first and second trap sites 80A and 80B allowing the charge applied through the first and second lower word lines 30A and 30B to be tunneled and/or captured. Accordingly, a non-volatile memory device may be realized.

A multi-bit electro-mechanical memory device according to example embodiments may have a structure in which the first and second lower word lines 30A and 30B and the first and second trap sites 80A and 80B are stacked. Therefore, the length of the first and second cantilever electrodes 50A and 50B may be shortened as compared to the length of a cantilever electrode in a conventional memory device. Because parts electrically contacted or pulled by the first and second cantilever electrodes 50A and 50B are not individually made, the integration density of the memory device may be increased.

However, if no charge is applied to the first and second trap sites 80A and 80B or if a charge of the same polarity is applied between the first and second cantilever electrodes 50A and 50B and the first and second trap sties 80A and 80B, the first and second cantilever electrodes 50A and 50B may be separated from the first and second trap sites 80A and 80B by the electrostatic force corresponding to repulsion. For example, the first and second cantilever electrodes 50A and 50B may be formed of titanium, nitride titanium, or a carbon nanotube material. The titanium and nitride titanium may not be easily oxidized if exposed to the air through the first and second lower vacant spaces 90A and 90B. The titanium and nitride titanium may be conductive metal materials with an elasticity of a desired, or alternatively, a predetermined modulus of elasticity above which the materials are not deformed if bent to have a curve of a desired, or alternatively, a predetermined level. The carbon nanotube may have a tube shape in which hexagonal shapes respectively formed of six atoms of carbon are linked to one another. The tube may be only a few of nanometers to several tens of nanometers in diameter. The carbon nanotube may have an electric conductivity similar to that of copper and/or the same thermal conductivity as diamond, which may have the highest thermal conductivity in the natural world. The carbon nanotube may be hundreds of times greater than steel in strength. While carbon fiber may be broken down by only 1% deformation, a carbon nanotube may have resiliency to be durable up to 15% deformation.

On the first and second cantilever electrodes 50A and 50B, a first upper word line 40A and a second upper word line 40B may be respectively formed to float at a desired, or alternatively, a predetermined height from the first cantilever electrode 50A and the second cantilever electrode 50B by a first upper vacant space 92A and a second upper vacant space 92B, respectively. For example, the first lower vacant space 90A, the second lower vacant space 90B, the first upper vacant space 92A, and/or the second upper vacant space 92B may be referred to as a vacant space 94. The first upper word line 40A may be separated from the second upper word line 40B by the trench 100. For example, the first upper word line 40A and the second upper word line 40B may be referred to as an upper word line 40. The first and second upper word lines 40A and 40B may be respectively formed on the first and second lower word lines 30A and 30B in the second direction. A third interlayer insulating layer 28 for supporting the first and second upper word lines 40A and 40B and/or insulating the first upper word line 40A from the second upper word line 40B may be formed on the second interlayer insulating layer 24 and/or the spacer at the outer edges of the first and second upper world lines 40A and 40B. The third interlayer insulating layer 28 may include a silicon oxide layer, a silicon nitride layer, or a silicon oxynitride layer to electrically insulate the first and second cantilever electrodes 50A and 50B from each other and/or the first and second upper word lines 40A and 40B from each other. A third hard layer mask 42 may be formed on the first and second upper word lines 40A and 40B.

Figure 9A:
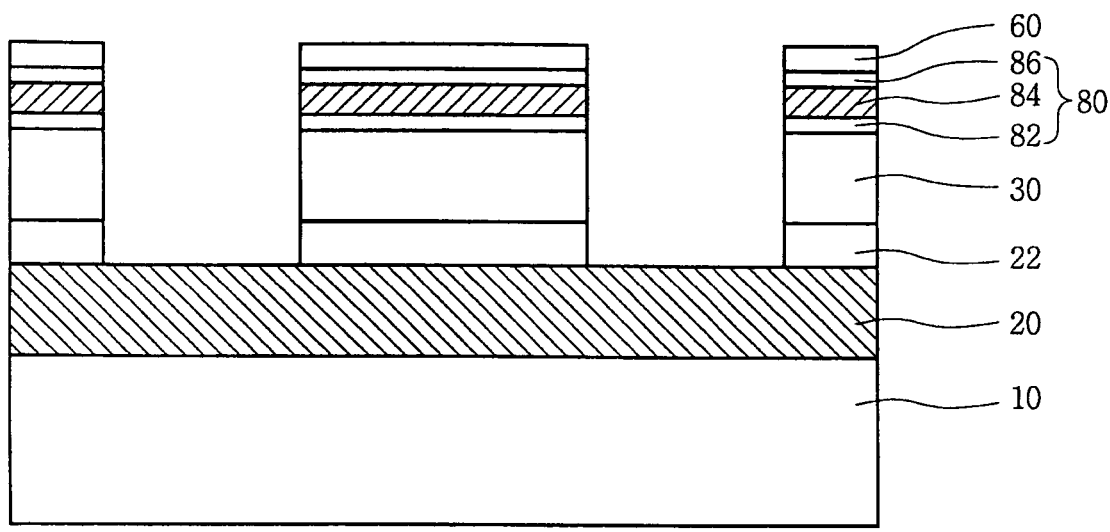
Figure 14A:
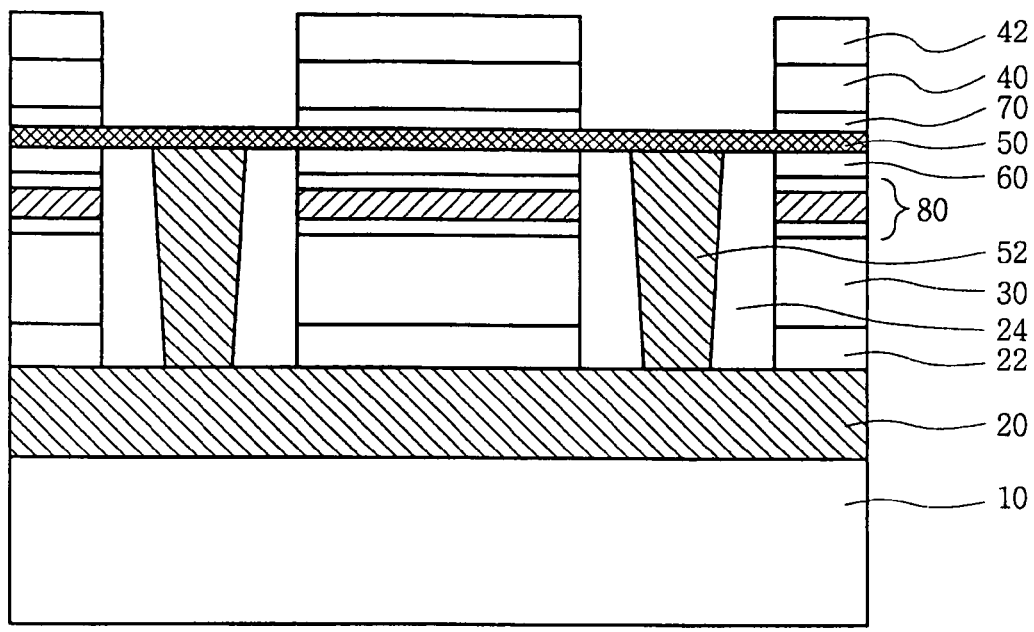

Although not illustrated, the first and second lower vacant spaces 90A and 90B and the first and second upper vacant spaces 92A and 92B may be respectively formed by removing a first sacrificial layer 60, for example, as shown in FIG. 9A, and a second sacrificial layer 70, for example, as shown in FIG. 14A, exposed by the trench 100. Therefore, the first and second lower vacant spaces 90A and 90B and the first and second upper vacant spaces 92A and 92B may be spaces where the ends of the first and second cantilever electrodes 50A and 50B may be respectively moved in the third direction (for example, the Z-axial direction) perpendicular to the substrate 10.

Therefore, the multi-bit electro-mechanical memory device according an example embodiment may have a unit cell 104 including memory units 102, e.g., a first memory unit 102A and/or a second memory unit 102B. The first and second memory units 102A and 102B may be respectively formed to be separated from each other by the trench 100 or the first and second memory units 102A and 102B may be separately and respectively formed at both sides centering the pad electrode 52. The first and second memory units 102A and 102B, which are adjacent to each other in the first direction (for example, the X-axial direction), may electrically share one bit line 20. The first and second memory units 102A and 102B of unit cells 104 adjacent to each other in the second direction (for example, the Y-axial direction) may electrically share the first or second lower word line 30A or 30B and/or the first or second upper word line 40A or 40B.

Because the first and second cantilever electrodes 50A and 50B, which are separated from each other at both sides centering the trench 100 or the pad electrode 52, comprise the unit cell 104 divided into the first and second memory units 102A and 102B which may be individually switched, 2-bit or more data per unit cell 104 can be input or output.

The first and second lower word lines 30A and 30B, to which the electrical signals are applied to switch the first and second cantilever electrodes 50A and 50B, may be formed of a conductive metal material having a resistance lower than that of the polysilicon material used in a conventional memory device. Therefore, because power consumption may be reduced, productivity may be increased.

Figure 4:
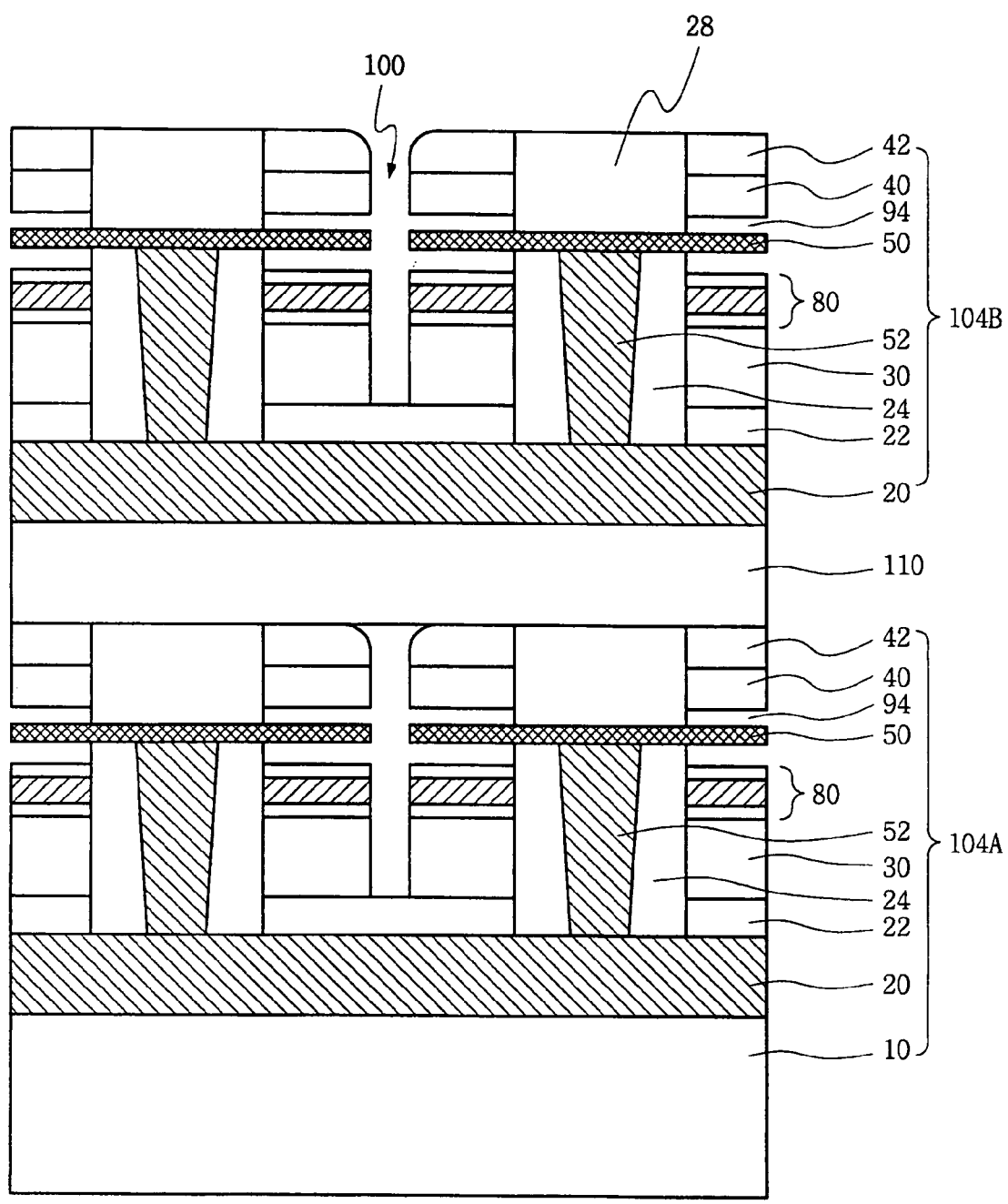
FIG. 4 is a sectional view of a structure in which multi-bit electro-mechanical memory devices of FIG. 3 are stacked according to an example embodiment.

FIG. 4 is a sectional view of a structure in which a multi-bit electro-mechanical memory devices of FIG. 3 are stacked according to an example embodiment. A stacked multi-bit electro-mechanical memory device according to an example embodiment may include a first unit cell 104A and a second unit cell 104B. A fourth interlayer insulating layer 110 may be formed on a top end of the first unit cell 104A and between the first unit cell 104A and the second unit cell 104B. The inside of the trench 100 of each of the first and second unit cells 104A and 104B may be in a vacuum and/or empty so that the cantilever electrode 50 may move vertically. However, the inside of the trench 100 of each of the first and second unit cells 104A and 104B may be filled with a non-reactive gas, for example, a nitrogen gas or an argon gas. The fourth interlayer insulating layer 110 may be formed to cover an upper portion of the first unit cell 104A to distinguish the first unit cell 104A from the second unit cell 104B. The fourth interlayer insulating layer 110 may not be introduced inside the vacant space through the trench 100. For example, the fourth interlayer insulating layer 110 may be formed of a polymer material on the third interlayer insulating layer 28 at the top end of the trench 100. Although not illustrated, the bit line 20 of the first unit cell 104A and the bit line 20 of the second unit cell 104B may be formed in different directions from each other, and/or the trench 100 of the first unit cell 104A and the trench 100 of the second unit cell 104B may be formed to be deviated from each other.

Therefore, because the multi-bit electro-mechanical memory device according an example embodiment may be formed in a structure including the second unit cell 104B stacked on the fourth interlayer insulating layer 110 on the first unit cell 104A formed on the substrate 10, the integration density of the memory device may be increased. However, example embodiments are not limited thereto, and any number of unit cells and/or insulating layers may be stacked on the substrate 10.

A method of operating a multi-bit electro-mechanical memory device according to an example embodiment will be described below.

The first and second lower word lines 30A and 30B, the first and second cantilever electrodes 50A and 50B, and the first and second upper word lines 40A and 40B may be respectively described as the lower word line 30, the cantilever electrode 50, and the upper word line 40. The reference numerals thereof may be mixed for explanation. The first and second lower vacant spaces 90A and 90B and the first and second upper vacant spaces 92A and 92B may be respectively described as the lower vacant space 90 and the upper vacant space 92, and/or the lower vacant space 90 and the upper vacant space 92 will be described as a vacant space 94 which is a different reference numeral.

In the multi-bit electro-mechanical memory device according to an example embodiment, data may be programmed, deleted, written and/or read depending on the position of the cantilever electrode 50. For example, as the end of the cantilever electrode 50 is bent in the third direction perpendicular to the substrate 10 by the electric field induced in the vacant space 94, the cantilever electrode 50 may contact with the lower word line 30, e.g., through the trap site 80 on the lower word line 30, or the upper word line 40. The end of the cantilever electrode 50 may be in a level state in the vacant space 94 between the lower word line 30 and the upper word line 40, and/or the end of the cantilever electrode 50 may be supported at a height the same as or similar to the height of the top surface of the second interlayer insulating layer 24.

Accordingly, the program, deletion, writing and/or reading of the first and second memory units 102A and 102B of the unit cell 104 may be performed by controlling a difference of voltages respectively applied to the bit line 20, the lower word line 30, and/or the upper word line 40. For example, if a desired, or alternatively, a predetermined voltage is independently applied to each of the first and second lower word line 30A and 30B, and if a desired, or alternatively, a predetermined voltage is independently applied to each of the first and second upper word line 40A and 40B, the first and second memory units 102A and 102B may be programmed to be the same as each other, for example, both the first and second memory units 102A and 102B may be programmed as "1" or "0", or to be different from each other, for example, one of the first and second memory units 102A and 102B may be programmed as "1" and the other may be programmed as "0", at the same time. Therefore, in the multi-bit electro-mechanical memory device according to an example embodiment, the unit cell 104 may be configured to combine the data to be input or output in each of the first and second memory units 102A and 102B. Because the first and second memory units 102A and 102B electrically share one bit line 20, the writing operation of each state may not be performed simultaneously with the reading operation thereof. Any one of the first and second memory units 102A and 102B may electrically occupy the bit line 20 at a given time.

Therefore, a multi-bit electro-mechanical memory device according to an example embodiment may be configured to input or output 2-bit data in a single cell comprising the first and second memory units 102A and 102B which are formed symmetrically to each other centering the trench 100 or the pad electrode 52, and which may be programmed to have a same state as each other or a different state from each other.

As described above, if a charge having polarity opposite to that of the charge applied to the lower word line 30 and the trap site 80 is applied to the cantilever electrode 50, the cantilever electrode 50 may be bent to contact to the trap site 80 by the electrostatic force acting as attraction between the cantilever electrode 50 and the lower word line 30. If a charge of the same polarity as that of the charge applied to the lower word line 30 and the trap site 80 is applied to the cantilever electrode 50, the cantilever electrode 50 may be separated from the trap site 80 by the electrostatic force acting as repulsion. If the cantilever electrode 50 is bent to contact the trap site, the cantilever electrode 50 may overcome a desired, or alternatively, a predetermined elasticity or resilience. The elasticity or resilience may be proportional to the distance of movement according to Hooke's Law, and/or the electrostatic force may be proportional to the square of the distance of movement according to Coulomb's Law. Therefore, the direction of movement of the cantilever electrode 50 may be decided by the electrostatic force generated depending on the polarity and quantity of the charges applied to the lower word line 30 and the trap site 80.

FIGS. 5A, 5B, 6A and 6B are sectional views for explaining an operation of programming/writing and/or reading data in a multi-bit electro-mechanical memory device according to an example embodiment.

Figure 5A:
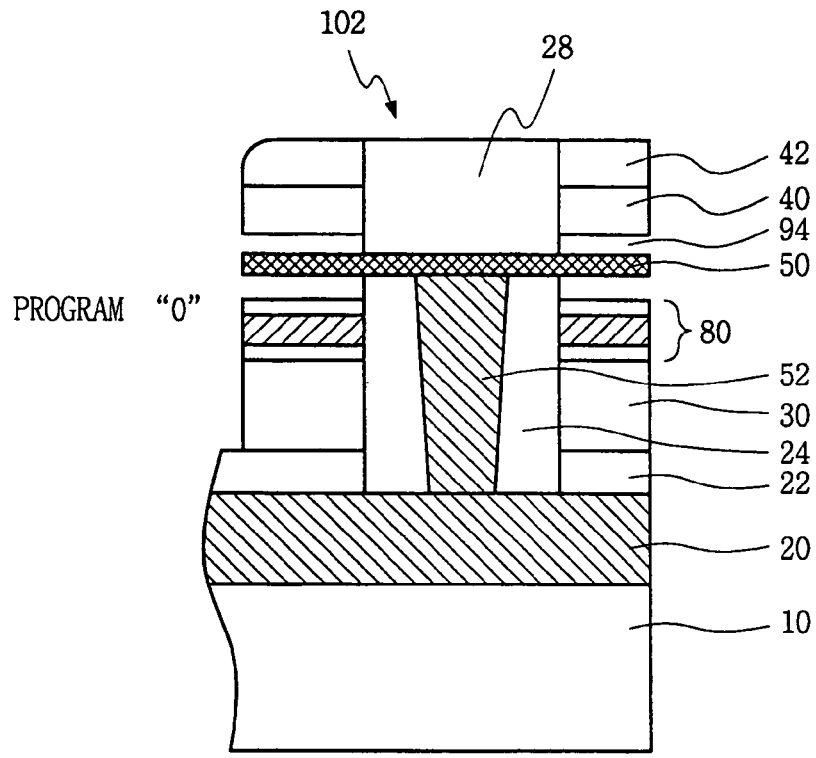
Figure 5B:
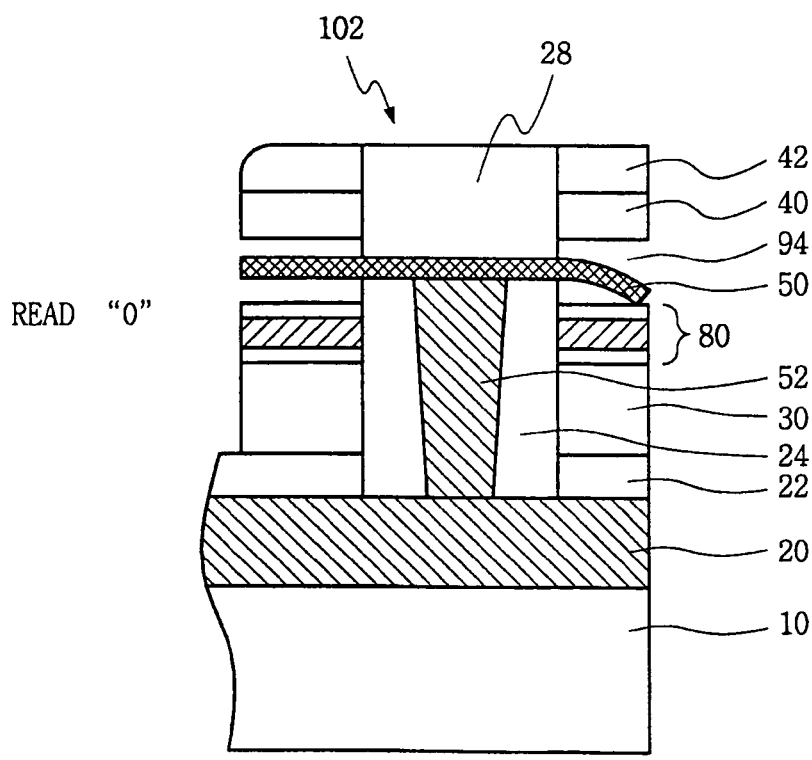

As illustrated in FIGS. 5A and 5B, if the multi-bit electro-mechanical memory device needs to program/write data corresponding to "0", a desired, or alternatively, a predetermined first voltage (for example, $V_{pull-in}$) may be applied between the lower word line 30 and the bit line 20, to bend the cantilever electrode 50 in the third direction so as to contact the trap site 80. Writing the data corresponding to "0" may be called a "0" program. Therefore, if the desired, or alternatively, the predetermined first voltage is applied between the bit line 20 and the lower word line 30 and the cantilever electrode 50 is bent to contact with the trap site 80, the data corresponding to "0" may be written/programmed. If a second voltage induced between the bit line 20 and the lower word line 30 is compared with a third voltage induced between the bit line 20 and the upper word line 40 and, the third voltage is greater than the second voltage, the data corresponding to "0" may be read. Because the distance between the cantilever electrode 50 and the lower word line 30 may be shorter than the distance between the cantilever electrode 50 and the upper word line 40, and/or the voltage may be proportional to the reciprocal of the distance, the data corresponding to "0" may be read.

Therefore, a multi-bit electro-mechanical memory device according to an example embodiment may program/write the data corresponding to "0", by applying the desired, or alternatively, the predetermined first voltage to the cantilever electrode 50 electrically connected to the bit line 20 and to the lower word line 30 so that the cantilever electrode 50 may be bent to contact the trap site 80. The multi-bit electro-mechanical memory device may read the data corresponding to "0" if the second voltage induced between the bit line 20 and the lower word line 30 is greater than the third voltage induced between the bit line 20 and the upper word line 40 by comparing the second voltage with the third voltage.

As illustrated in FIGS. 6A and 6B, if the multi-bit electro-mechanical memory device needs to program/write the data corresponding to "1", a desired, or alternatively, a predetermined fourth voltage (for example, $V_{pull-out}$) may be applied between the lower word line 30 and the bit line 20, to separate the cantilever electrode 50 from the trap site 80. If the trap site 80 and the cantilever electrode 50 are already separated from each other, the fourth voltage may not be applied. Writing the data corresponding to "1" may be called a "1" program. If the second voltage induced between the bit line 20 and the lower word line 30 is compared with the third voltage induced between the bit line 20 and the upper word line 40, and if the second voltage is greater than the third voltage, the data corresponding to "1" may be read. If the data corresponding to "1" is read, because the cantilever electrode 50 may be positioned to be closer to the upper word line 40 than the lower word line 30, the cantilever electrode 50 may be bent to electrically contact the upper word line 40 by the electrostatic force acting as the attraction between the cantilever electrode 50 and the upper word line 40.

Therefore, a multi-bit electro-mechanical memory device according to an example embodiment may program/write data corresponding to "0" or "1" if the cantilever electrode 50 is bent to contact with the trap site 80 or if the cantilever electrode 50 is separated from the trap site 80. The multi-bit electro-mechanical memory device may read the data corresponding to "0" or "1" if the cantilever electrode 50 is bent to contact with the upper word line 40 or if the cantilever electrode 50 is bent to contact with the trap site 80.

Figure 7:
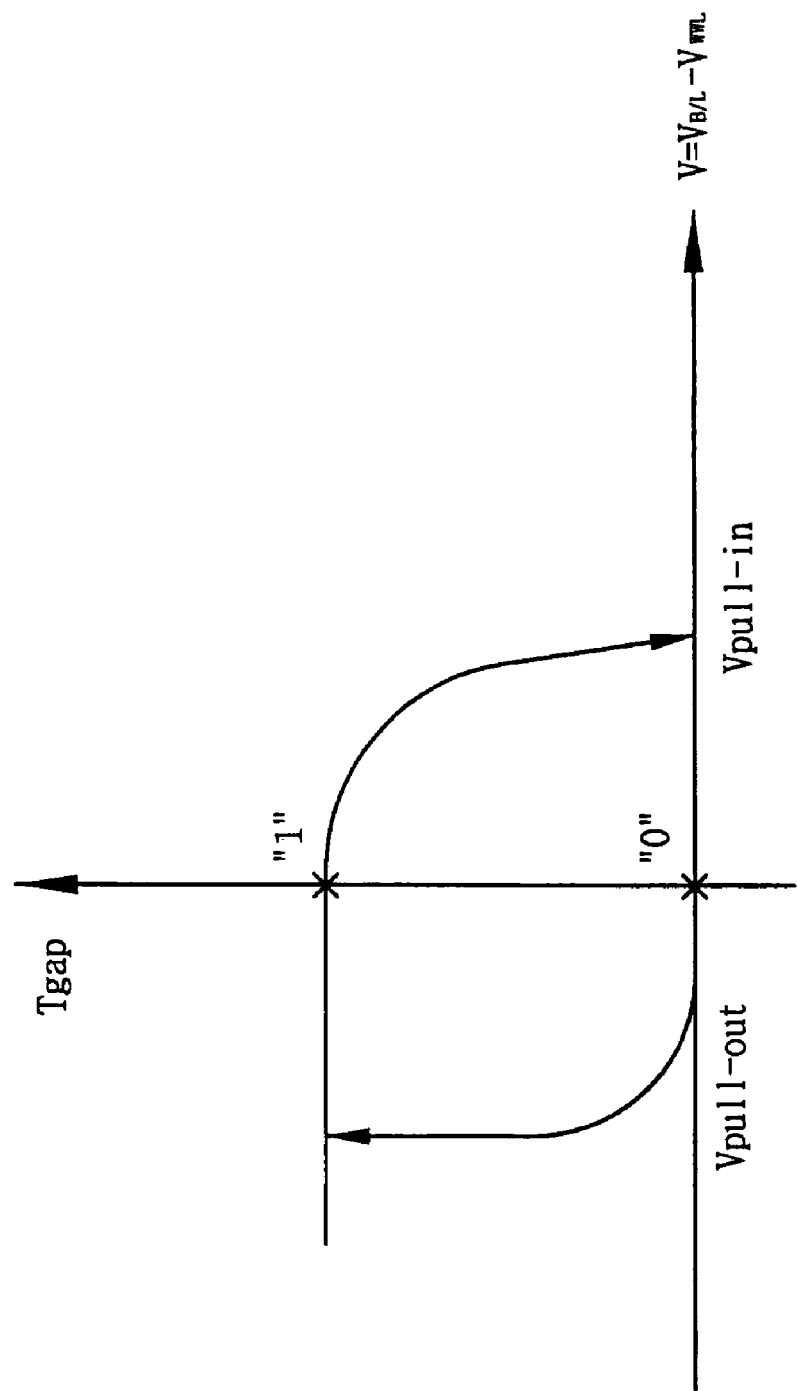
FIG. 7 is an example graph of the relation between a voltage, which is applied through a bit line and a lower word line of a multi-bit electro-mechanical memory device, and a bending distance of a cantilever electrode according to an example embodiment.

FIG. 7 is an example graph of the relation between a voltage, which is applied through the bit line 20 and the lower word line 30 of the multi-bit electro-mechanical memory device, and a bending distance of the cantilever electrode 50. If the voltage of "$V_{pull-in}$" having a positive value is applied between the bit line 20 and the lower word line 30, the cantilever electrode 50 may be bent to contact the trap site 80, so that the data corresponding to "0" are programmed/written. If the voltage of "$V_{pull-out}$" having a negative value is applied between the bit line 20 and the lower word line 30, the cantilever electrode 50 may become more distant from the lower word line 30, so that the data corresponding to "1" are programmed/written. In the example graph, the horizontal axis represents the voltage, and the vertical axis represents the distance Tgap of movement of the cantilever electrode 50 from the surface of the trap site 80 to the upper word line 40. Therefore, if the voltage of "$V_{pull-in}$" having the positive value or the voltage of "$V_{pull-out}$" having the negative value is applied to the cantilever electrode 50 connected with the bit line 20 and to the lower word line 30, the cantilever electrode 50 may contact the trap site 80 or may be further separated from the trap site 80 on the lower word line 30, so that digital data corresponding to 1-bit having a value of "0" or "1" may be programmed/written.

The voltage "$V_{pull-in}$" and the voltage "$V_{pull-out}$" may be decided by the following formula:

$$V = V_{B/L} - V_{WWL} \quad (1)$$

V is the voltage of "$V_{pull-in}$" or the voltage of "$V_{pull-out}$" $V_{B/L}$ is the voltage applied to the bit line 20, and $V_{WWL}$ is the voltage applied to the lower word line 30. The voltage of "$V_{pull-in}$" may have the positive value, and/or the voltage of "$V_{pull-out}$" may have the negative value. For example, if the voltage of "$V_{pull-in}$" is the same as or similar to the absolute value of the voltage of "$V_{pull-out}$" and if the data corresponding to the value of "0" needs to be programmed/written, a ½ voltage of "$V_{pull-in}$" may be applied to the bit line 20 and a ½ voltage of "$V_{pull-out}$" may be applied to the lower word line 30, so that the cantilever electrode 50 may electrically contact with the lower word line 30.

If the data corresponding to the value of "1" needs to be programmed/written, a ½ voltage of "$V_{pull-out}$" may be applied to the bit line 20 and a ½ voltage of "$V_{pull-in}$" may be applied to the lower word line 30, so that the cantilever electrode 50 may be further separated from the lower word line 30. Although not illustrated, the bit line 20, the lower word line 30, and/or upper word line 40 may be set to a ground state if no voltage of "$V_{pull-in}$" or "$V_{pull-out}$" is applied.

A method of fabricating a multi-bit electro-mechanical memory device according to an example embodiment will be described below.

FIGS. 8A through 18B are process sectional views for explaining a method of fabricating a multi-bit electro-mechanical memory device according to an example embodiment. FIGS. 8A through 18A are sectional views taken along with Line I-I' of FIG. 2. FIGS. 8B through 18B are the sectional views taken along with Line II-II' of FIG. 2.

Figure 8A:
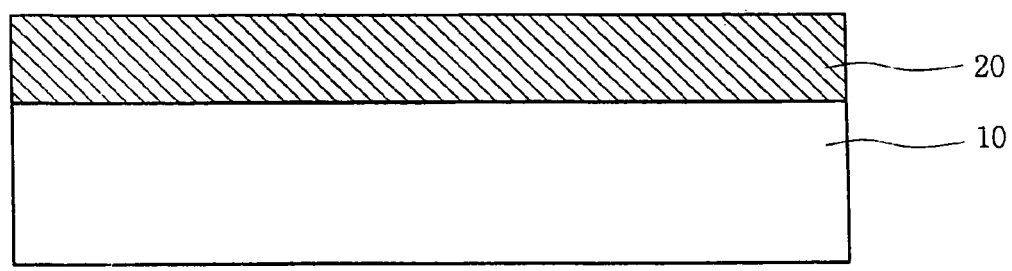
FIGS. 8A through 18B are process sectional views for explaining a method of fabricating a multi-bit electro-mechanical memory device according to an example embodiment.
Figure 8B:
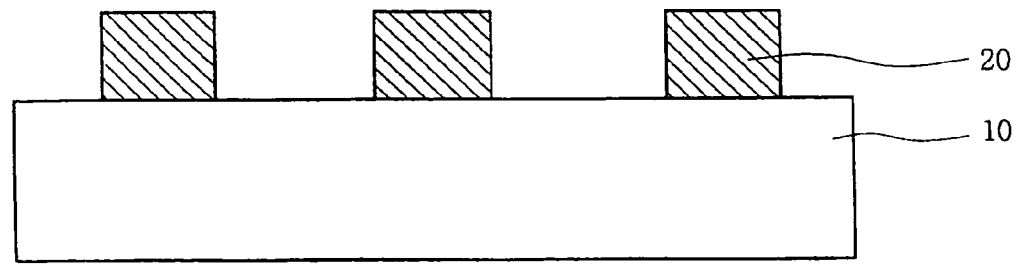

As illustrated in FIGS. 8A and 8B, a bit line 20 may be formed to a desired, or alternatively, a predetermined thickness on a level substrate 10 in a first direction. For example, a plurality of bit lines 20 may be formed to be parallel to one another in the first direction on the substrate 10. For example, the bit lines 20 may include a conductive metal material, for example, gold, silver, copper, aluminum, tungsten, tungsten silicide, titanium, nitride titanium, tantalum or tantalum silicide, which may be formed by a physical vapor deposition method or a chemical vapor deposition method, or a crystalline silicon or polysilicon material which may be doped with conductive impurities. Although not illustrated, the bit lines 20 may be formed by an anisotropic etching process using a dry etching method in which a photoresist pattern or a first hard mask layer is used as an etching mask layer. The photoresist pattern or first hard mask layer may have a desired, or alternatively, a predetermined critical dimension on the conductive metal layer or polysilicon layer which is formed to the desired, or alternatively, the predetermined thickness on the entire surface of the substrate. For example, a reaction gas, which is used for the dry etching method performed on the conductive metal layer or polysilicon layer, may be formed of a strong acid mixing a sulphuric acid and a nitric acid. The bit line 20 may be formed to have the thickness of about 200 Å and a critical dimension of about 50 Å.

Figure 9B:
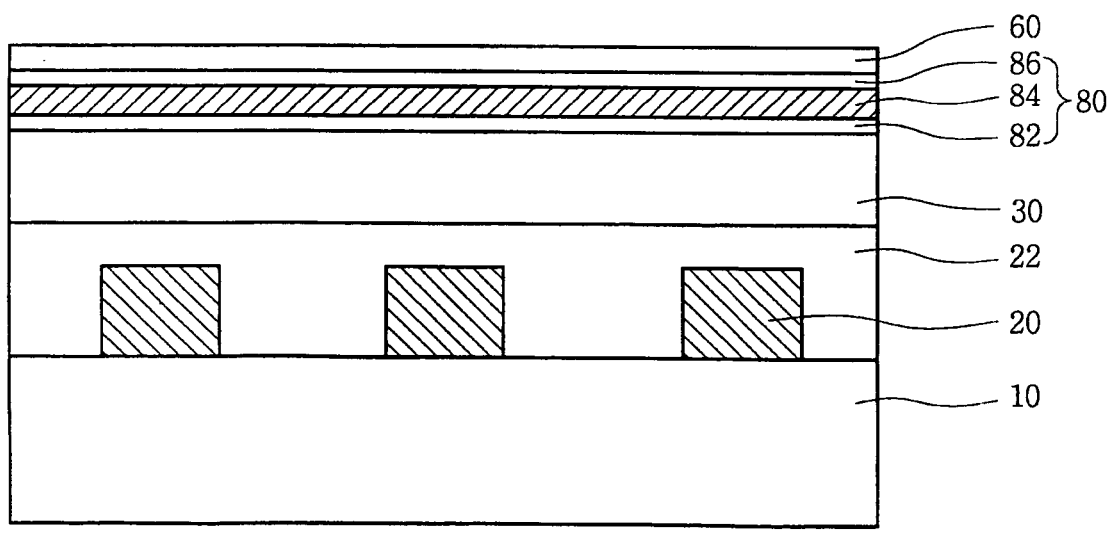

As illustrated in FIG. 9A and 9B, a first interlayer insulating layer 22, a lower word line 30, a trap site 80, and/or a first sacrificial layer 60 may be formed at desired, or alternatively, predetermined critical dimensions in a second direction crossing the bit line 20. The first interlayer insulating layer 22, the lower word line 30, and the first sacrificial layer 60, which are respectively formed to their respective desired, or alternatively, predetermined thicknesses, may be stacked and/or anisotropically etched by a dry etching method using a second hard mask layer (not shown) or a photoresist pattern (not shown) formed on the first sacrificial layer 60 as an etching mask layer. For example, a "stack" including the first interlayer insulating layer 22, the lower word line 30, and/or the first sacrificial layer 60 may be formed. The second hard mask layer and the photoresist pattern may be removed. For example, the first interlayer insulating layer 22 may include a silicon oxide layer or a silicon nitride layer formed to a thickness of about 150 Å to 200 Å by a chemical vapor deposition method. The first interlayer insulating layer 22 may perform a function of an etching stop layer in a process of forming a trench 100 to divide the lower word line 30 in a length direction, e.g., the second direction. The lower word line 30 may include a conductive metal material, for example, gold, silver, copper, aluminum, tungsten, tungsten silicide, titanium, nitride titanium, tantalum or tantalum silicide, which is formed to a thickness of about 200 Å by the physical vapor deposition method or chemical vapor deposition method for higher conductivity. The trap site 80 may include a first silicon oxide layer 82, a silicon nitride layer 84, and/or a second silicon oxide layer 86, which are respectively formed to thicknesses of about 100 Å, 200 Å, and 100 Å, respectively, by a chemical vapor deposition method. The first sacrificial layer 60 may include a polysilicon layer which is formed to a thickness of about 30 Å to 50 Å by an atomic layer deposition method or a chemical vapor deposition method. The first sacrificial layer 60, the lower word line 30, the trap site 80, and/or the first interlayer insulating layer 22 may be formed to have critical dimensions of about 50 Å. A reaction gas, which is used for a dry etching method to pattern the first sacrificial layer 60, the lower word line 30, the trap site 80, and/or the first interlayer insulating layer 22, may use a carbon fluoride series gas, for example, a CxFy series gas or a CaHbFc series gas. Examples of the carbon fluoride series gases may be, for example, $CF_4$, $CHF_3$, $C_2F_6$, $C_4F_8$, $CH_2F_2$, $CH_3F$, $CH_4$, $C_2H_2$ and $C_4F_6$, or mixtures thereof.

Figure 10A:
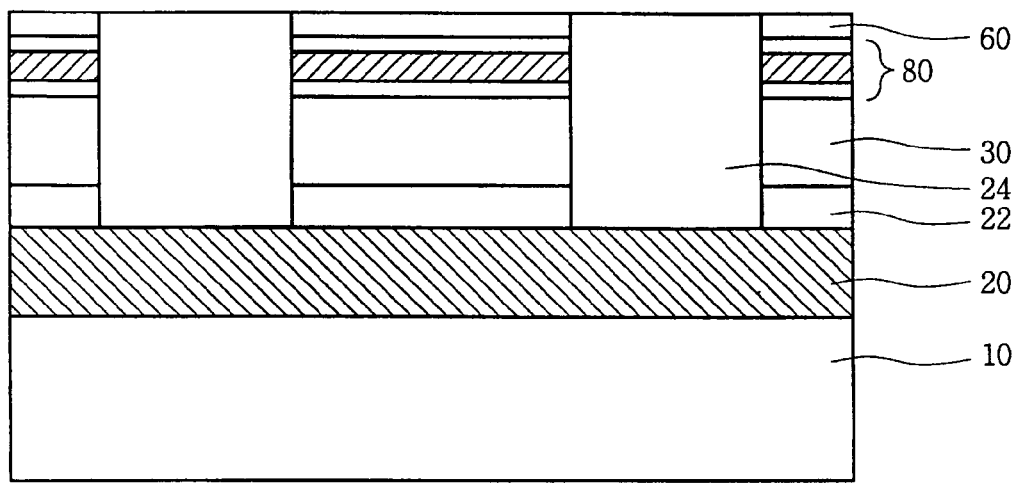
Figure 10B:
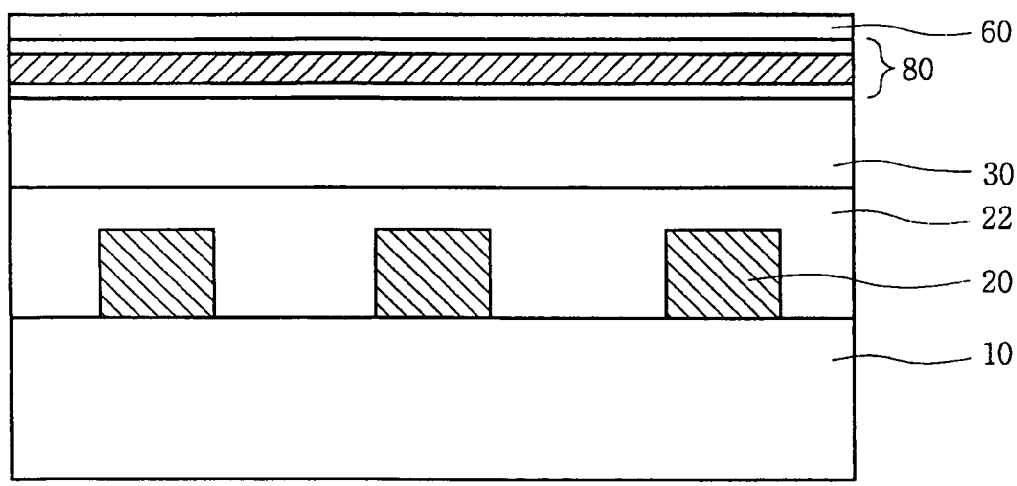

As illustrated in FIGS. 10A and 10B, a second interlayer insulating layer 24 may be formed to fill sidewalls of the "stack" including the first interlayer insulating layer 22, the lower word line 30, the trap site 80, and/or the first sacrificial layer 60. The second interlayer insulating layer 24 may be formed to electrically insulate a unit cell 104 including the first interlayer insulating layer 22, the lower word line 30, the trap site 80, and/or the first sacrificial layer 60 from another unit cell 104. For example, the second interlayer insulating layer 24 may be formed by forming a silicon oxide layer to fill the "stack" on the entire surface of the substrate 10 by a chemical vapor deposition method and by removing the silicon oxide layer to expose the first sacrificial layer 60.

Before the second interlayer insulating layer 24 is formed, a spacer (not shown) may be formed on the sidewalls of the "stack" including the first interlayer insulating layer 22, the lower word line 30, the trap site 80, and/or the first sacrificial layer 60. The spacer may cover the sidewalls of the "stack" and enable a contact hole 54 for forming a pad electrode 52 which will be described later to be more easily formed. For example, the spacer may be selectively formed on the sidewalls of the "stack" formed of the first interlayer insulating layer 22, the lower word line 30, the trap site 80, and the first sacrificial layer 60, by forming a silicon nitride layer to a desired, or alternatively, a predetermined thickness on the entire surface of the substrate 10 on which the "stack" is formed, and/or by removing the silicon nitride layer by a dry etching method which has a better anisotropic vertical etching characteristic. The second interlayer insulating layer 24 may be formed on the entire surface of the substrate 10 on which the spacer is formed. For example, the second interlayer insulating layer 24 may be formed by forming a silicon oxide layer on the entire surface of the substrate on which the stack is formed, so as to fill the sidewalls of the "stack," by a chemical vapor deposition method, and/or by removing the silicon oxide layer to expose the first sacrificial layer 60.

Figure 11A:
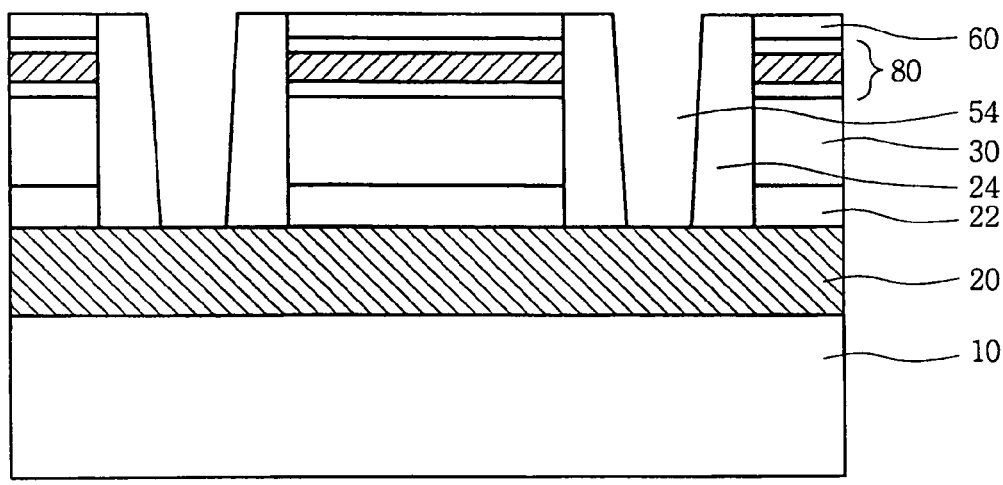
Figure 11B:
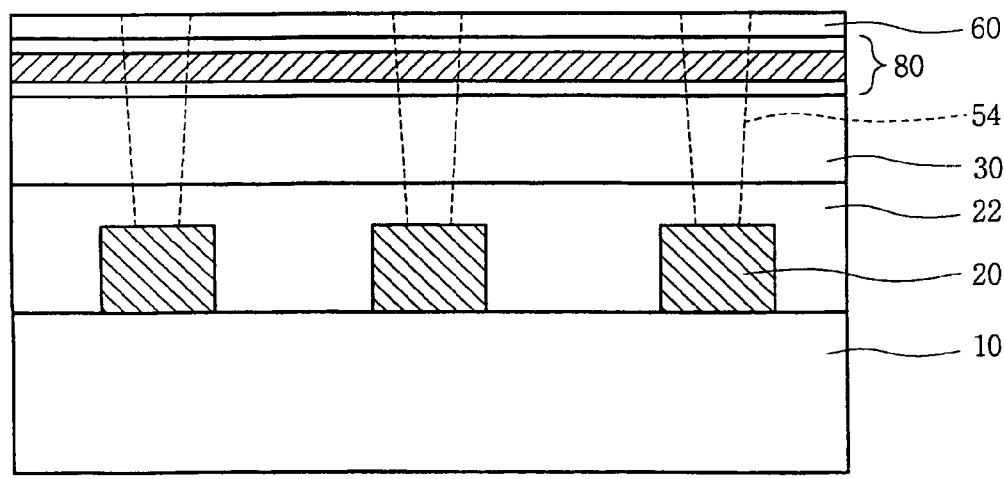

As illustrated in FIGS. 11A and 11B, at least a portion of the second interlayer insulating layer 24 on the bit line 20 may be removed to form the contact hole 54. The contact hole 54 may be formed such that the sidewalls of the first interlayer insulating layer 22, the lower word line 30, the trap site 80, and/or the first sacrificial layer 60 between the adjacent unit cells 104 are not exposed. The pad electrode 52 may be formed in the contact hole 54, and/or the pad electrode 52 may independently apply a charge to the bit line 20, the trap site 80, and/or the lower word line 30. For example, the contact hole 54 may be formed to have a radius of about 20 Å to 80 Å.

Figure 12A:
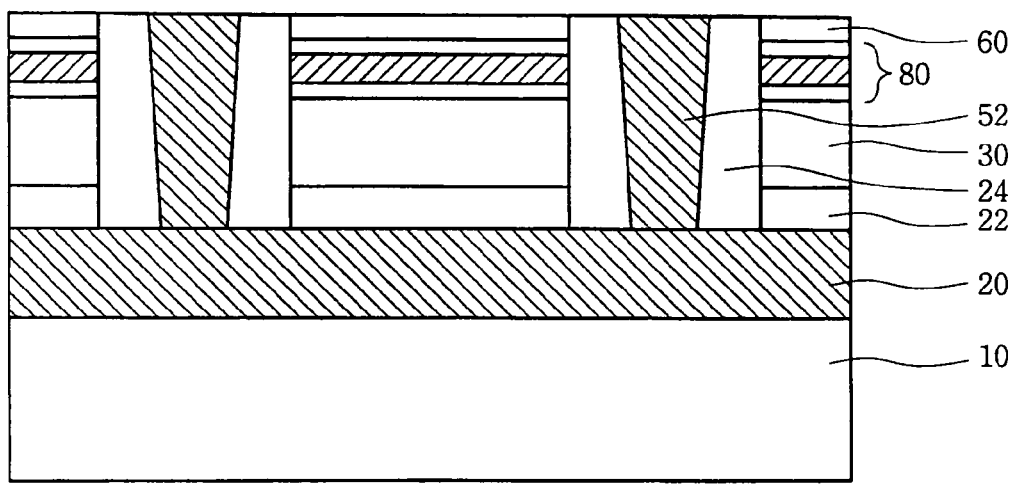
Figure 12B:
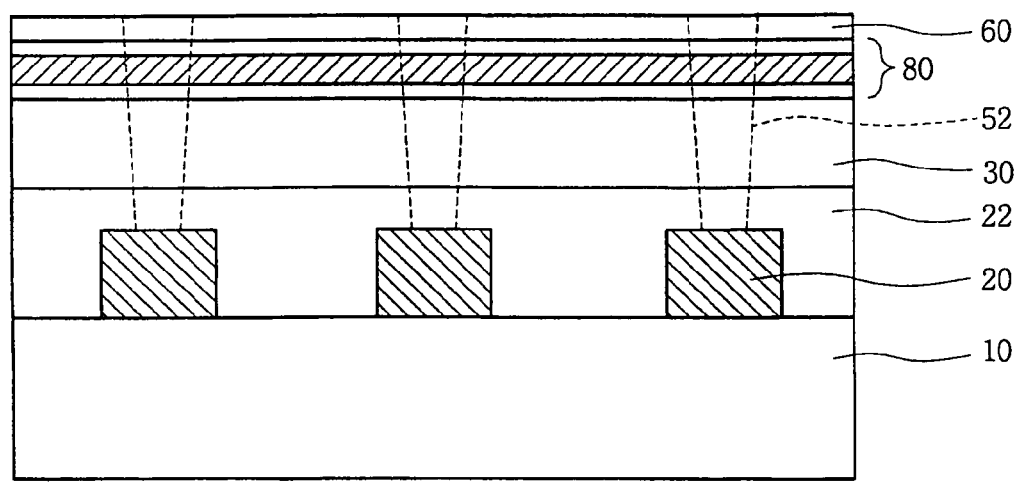

As illustrated in FIGS. 12A and 12B, the pad electrode 52 may be formed to fill the contact hole 54. The pad electrode 52 may be formed to be electrically connected to the bit line 20 exposed through the contact hole 54. At least one conductive layer (not shown) may be formed for an ohmic contact between the bit line 20 and the pad electrode 52. For example, the pad electrode 52 may be formed by forming polysilicon doped with conductive impurities, or conductive metal to fill the contact hole 54 at a desired, or alternatively, a predetermined thickness by a physical vapor deposition method or chemical vapor deposition method, and/or by removing the polysilicon or conductive metal to expose the second interlayer insulating layer 24 and/or the first sacrificial layer 60. Therefore, the pad electrode 52 may be formed to have a height the same as or similar to the height of the second interlayer insulating layer 24 and/or the first sacrificial layer 60. Before the pad electrode 52 is formed, a process of removing the oxide layer formed on the surface of the bit line 20 exposed through the contact hole 54 or an etching process may be performed.

Figure 13A:
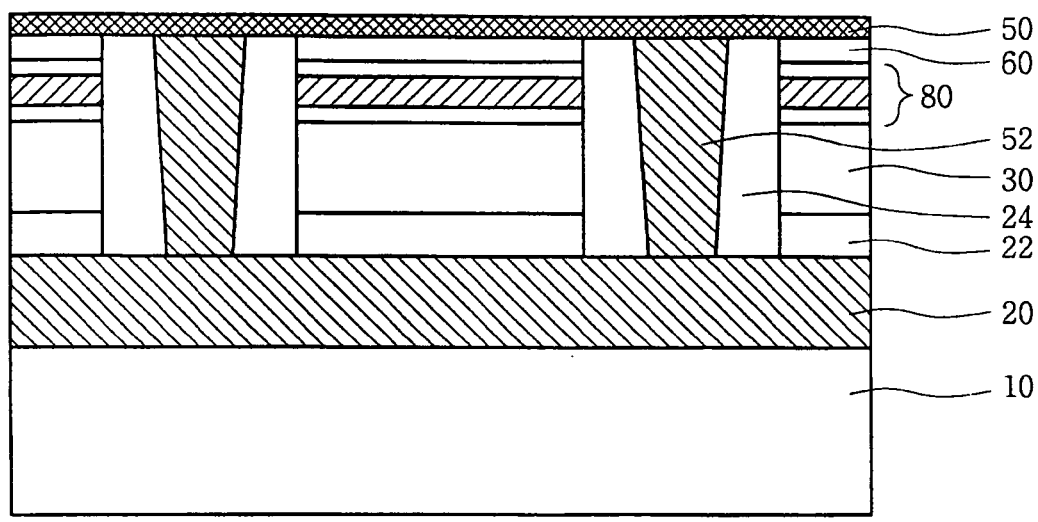
Figure 13B:
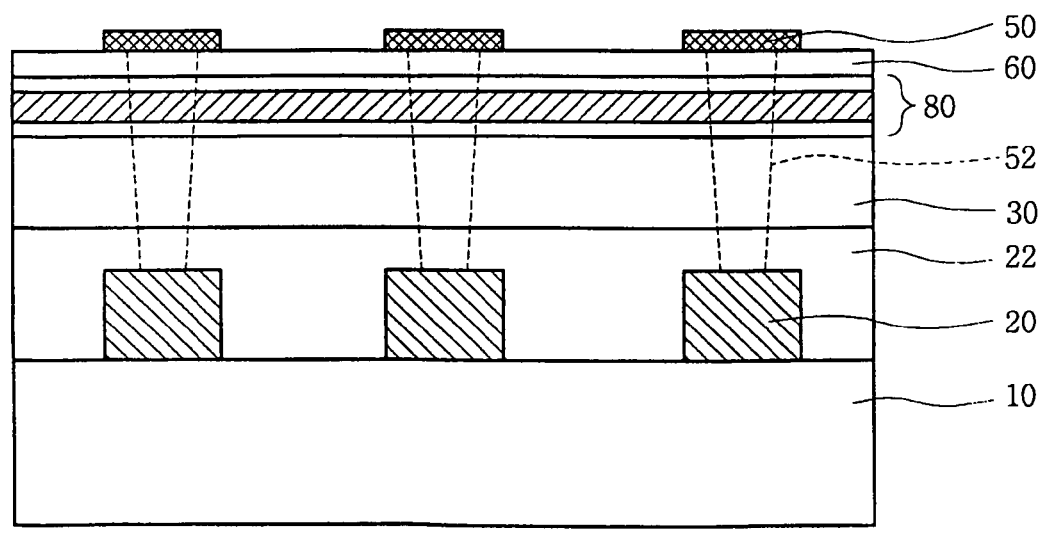

As illustrated in FIGS. 13A and 13B, a cantilever electrode 50 may be formed on the pad electrode 52, so as to cross, in the first direction, the top of the "stack" formed of the first sacrificial layer 60, the trap site 80, the lower word line 30, and the first interlayer insulating layer 22. The cantilever electrode 50 may be called an upper bit line because the cantilever electrode 50 may be formed on the stack and the pad electrode 52 so as to have critical dimensions which are the same as or similar to the critical dimensions of the bit line 20, and/or to be parallel to the bit line 20 in the first direction. The upper bit line may be formed as the cantilever electrode 50 with a node separated by the trench 100 which is formed by another process. For example, after the cantilever electrode 50 may be formed by forming titanium, nitride titanium or a carbon nanotube to a thickness of about 30 Å to 50 Å by a physical vapor deposition method, chemical vapor deposition method, or electrical discharge method, the cantilever electrode 50 may be patterned by a dry etching method using a photoresist pattern or the second hard mask layer (not shown), which shields the titanium, nitride titanium or carbon nanotube on the bit line 20, as an etching mask. The second hard mask layer may be removed with the patterning of the cantilever electrode 50 or it may remain on the cantilever electrode 50.

Therefore, because a method of fabricating a multi-bit electro-mechanical memory device according to an example embodiment may form the cantilever electrode 50, in the first direction, on the pad electrode 52, which is electrically connected to the bit line 20 formed on the substrate 10 in the first direction, an integration density of the memory device may be increased.

Figure 14B:
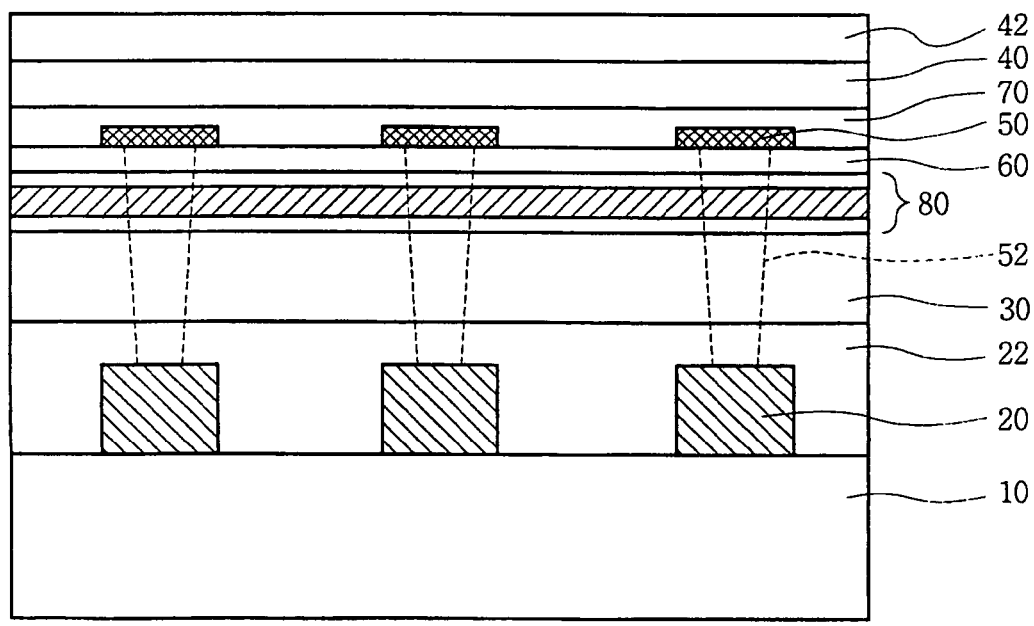

As illustrated in FIGS. 14A and 14B, a second sacrificial layer 70 and/or an upper word line 40 may be formed on the cantilever electrode 50. The second sacrificial layer 70 and the upper word line 40 may be formed in the second direction parallel to the first sacrificial layer 60, the trap site 80, and the lower word line 30. The second sacrificial layer 70 and the upper word line 40 may be formed symmetrically to the first sacrificial layer 60, the trap site 80, and the lower word line 30, and/or the cantilever electrode 50 may be interposed therebetween. For example, the second sacrificial layer 70 may be formed to a thickness of about 50 Å to 150 Å, and/or the second sacrificial layer 70 may include a polysilicon material formed by an atomic layer deposition method or a chemical vapor deposition method, for example, similar to the first sacrificial layer 60. The upper word line 40 may be formed to a thickness of about 200 Å. The second sacrificial layer 70 and the upper word line 40 may be respectively formed to have critical dimensions of about 50 Å.

The second sacrificial layer 70 and the upper word line 40 may be formed in the following manner. A polysilicon layer, a conductive metal layer, and/or a third hard mask layer 42 which have respective desired, or alternatively, predetermined thicknesses may be stacked on the second interlayer insulating layer 24, the first sacrificial layer 60, and/or the cantilever electrode 50 by a chemical vapor deposition method. A photoresist pattern for shielding the third hard mask layer 42 on the first sacrificial layer 60, the trap site 80, and the lower word line 30 may be formed, and/or the third hard mask layer 42 may be removed by a dry or wet etching method using the photoresist pattern as an etching mask. The photoresist pattern may be removed by an ashing process. The polysilicon layer and the conductive metal layer may be anisotropically etched by the dry or wet etching method using the third hard mask layer 42 as an etching mask, thereby forming the second sacrificial layer 70 and the upper word line 40.

Figure 15A:
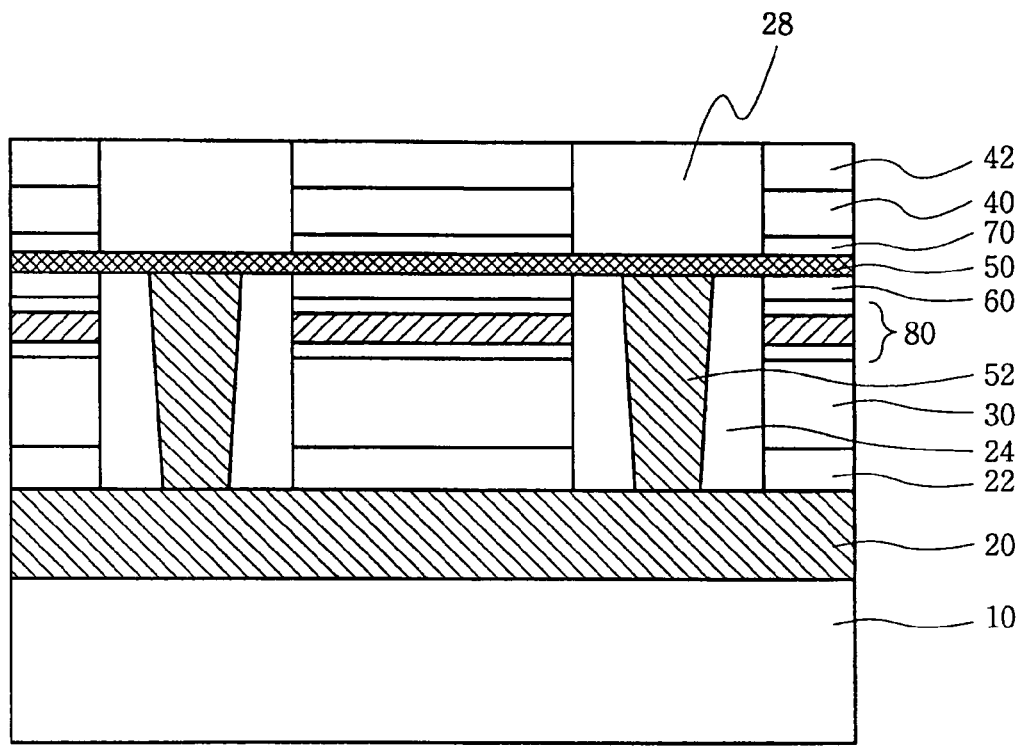
Figure 15B:
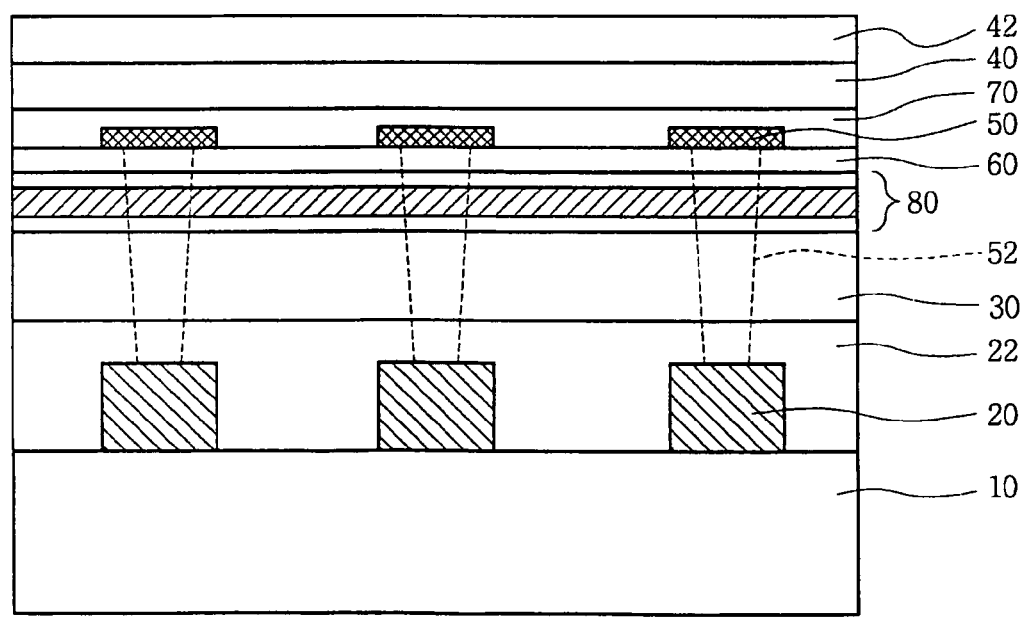

As illustrated in FIGS. 15A and 15B, a third interlayer insulating layer 28 of a desired, or alternatively, a predetermined thickness may be formed on the third hard mask layer 42 and the second interlayer insulating layer 24, and/or the third interlayer insulating layer 28 may be planarized to expose the third hard mask layer 42. The third interlayer insulating layer 28 may be formed to have a thickness greater than the second sacrificial layer 70 and/or the upper word line 40. Therefore, if the second sacrificial layer 70 is removed, the third interlayer insulating layer 28 may support a side of the upper word line 40 so that the upper word line 40 may float from the cantilever electrode 50. For example, the third interlayer insulating layer 28 may include a silicon oxide layer formed by a plasma chemical vapor deposition method. The third interlayer insulating layer 28 may be planarized by a chemical-mechanical polishing method. If the third interlayer insulating layer 28 is planarized using the upper word line 40 as a polishing stop layer, the upper word line 40 formed of the conductive metal layer may be damaged. Therefore, the third hard mask layer 42 may be to be used as the polishing stop layer.

Figure 16A:
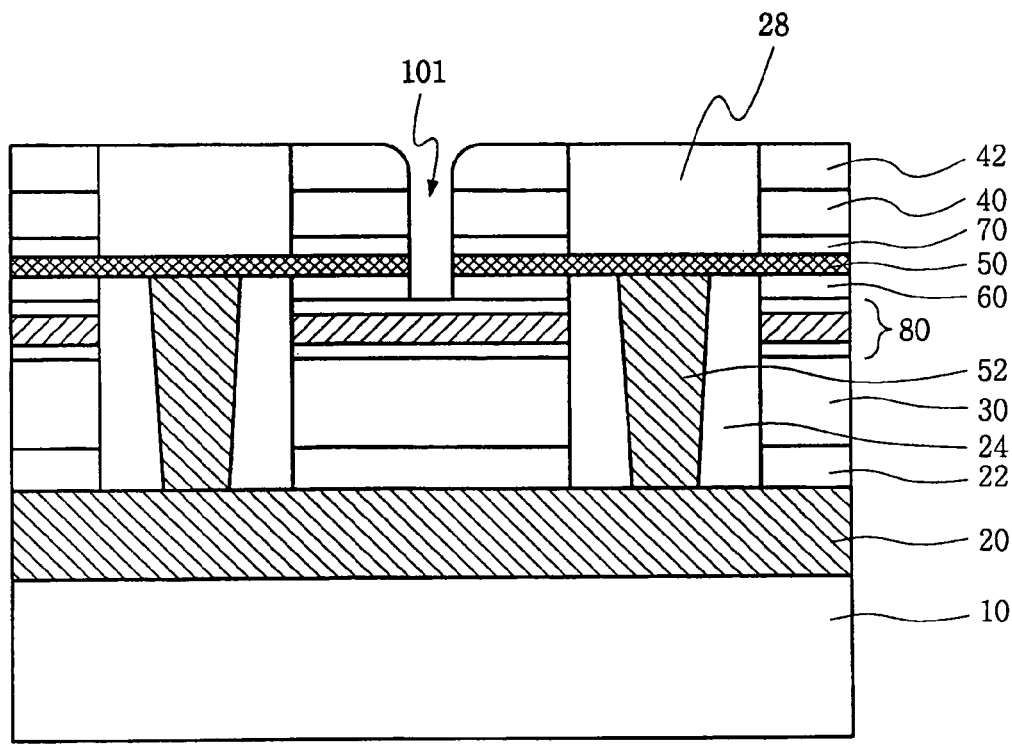
Figure 16B:
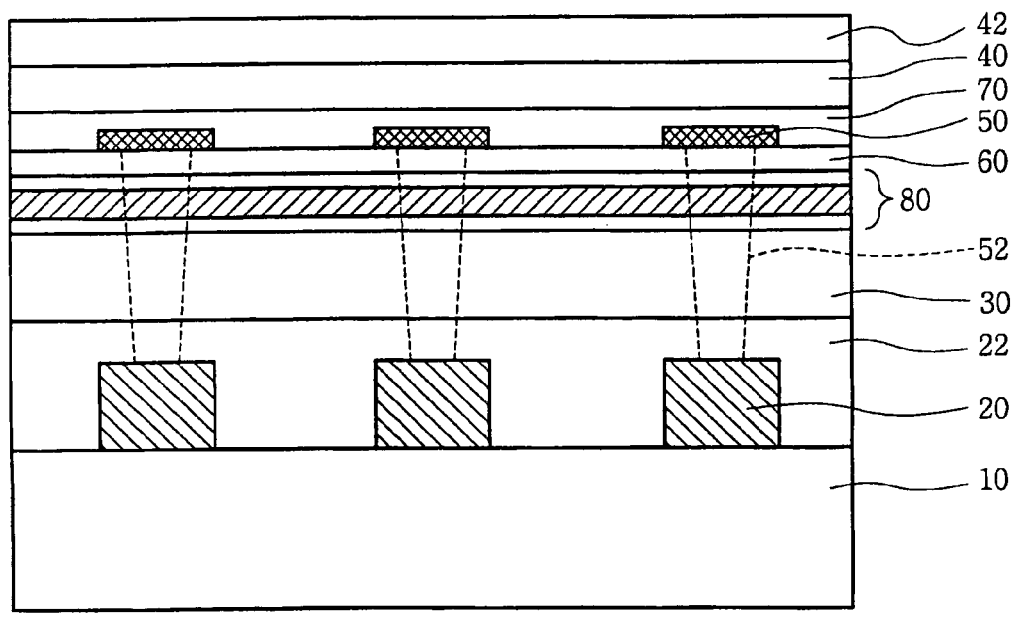

As illustrated in FIGS. 16A and 16B, a dummy trench 101 to expose the trap site 80 may be formed by etching the third hard mask layer 42 by a dry etching method using a photoresist pattern, which exposes the center of the third hard mask layer 42 on the upper word line 40 in the second direction, as an etching mask, by removing the photoresist pattern, and/or by removing the upper word line 40, the second sacrificial layer 70, the cantilever electrode 50, and/or the first sacrificial layer 60 by the dry etching method using the third hard mask layer 42 as an etching mask. The dummy trench 101 may be formed to separate the upper word line 40 in the second direction, to separate the node of the cantilever electrode 50, and/or to more easily remove the first sacrificial layer 60 and the second sacrificial layer 70 under the third hard mask layer 42 and the upper word line 40. For example, a reaction gas used for the dry etching method may be a carbon fluoride series gas, for example, a CxFy series gas or a CaHbFc series gas. Examples of the carbon fluoride series gases may be $CF_4$, $CHF_3$, $C_2F_6$, $C_4F_8$, $CH_2F_2$, $CH_3F$, $CH_4$, $C_2H_2$ and $C_4F_6$, or mixtures thereof. Therefore, the dummy trench 101 may have a desired, or alternatively, a predetermined critical dimension to symmetrically separate the upper word line 40, the second sacrificial layer 70, the cantilever electrode 50, and/or the first sacrificial layer 60 in the first direction. The dummy trench 101 may allow an etching solution or reaction gas to more easily flow, in which the etching solution or reaction gas is used for isotropically removing the first sacrificial layer 60 and second sacrificial layer 70 on the trap site 80 in another process. The trench 100 may be formed to have a critical dimension of about 30 Å to 800 Å.

Figure 17A:
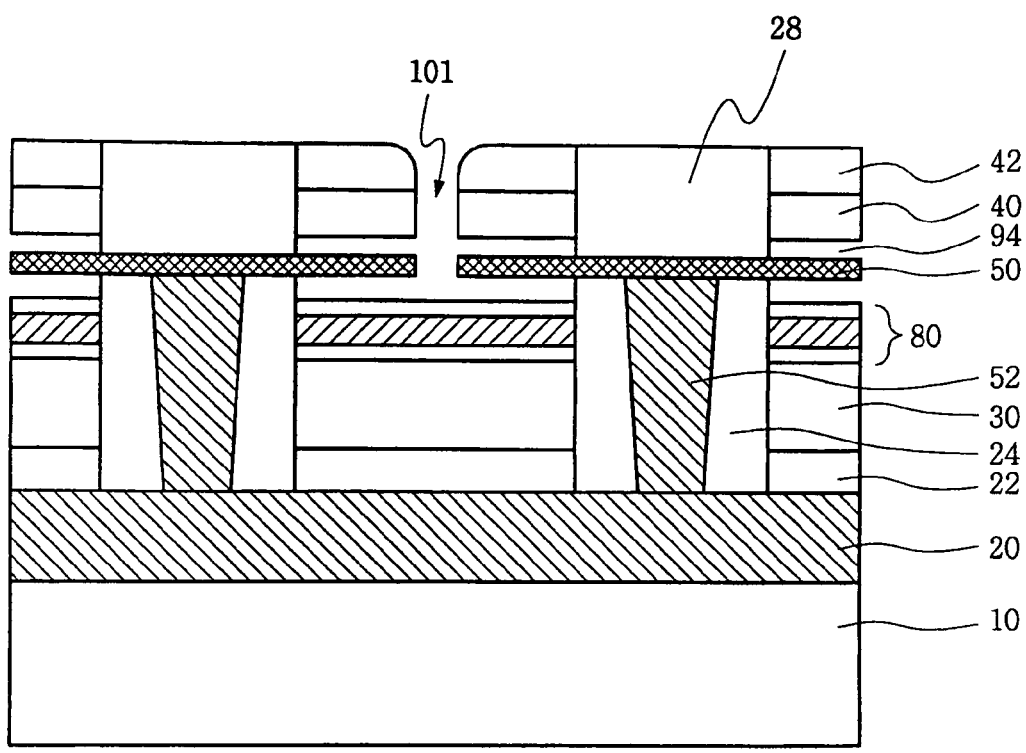
Figure 17B:
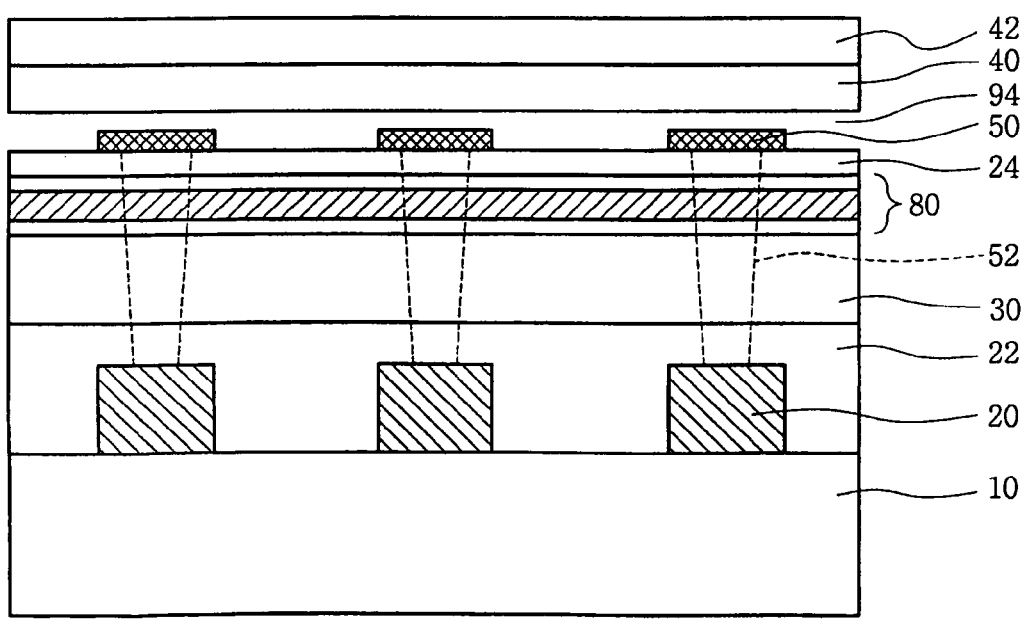

As illustrated in FIGS. 17A and 17B, a desired, or alternatively, a predetermined vacant space 94 where the cantilever electrode 50 floats may be formed between the lower word line 30 and the upper word line 40. The vacant space 94 may be formed by removing the first sacrificial layer 60 and/or the second sacrificial layer 70 exposed by the dummy trench 101. For example, the first sacrificial layer 60 and the second sacrificial layer 70 may be removed by allowing the sides thereof exposed at the sidewalls of the trench 100 to be laterally isotropically etched by a wet etching method or a dry etching method. The etching solution used for the wet etching method of the first sacrificial layer 60 and the second sacrificial layer 70, which may be composed of polysilicon materials, may include a mixed solution in which a strong acid, for example, a nitric acid, a fluoric acid or an acetic acid, is mixed with deionized water at a desired, or alternatively, a predetermined concentration. The reaction gas used for the dry etching method of the first sacrificial layer 60 and the second sacrificial layer 70 may be a carbon fluoride series gas, for example, $CF_4$, $CHF_3$, and/or others. The etching solution or reaction gas used for the wet etching method or the dry etching method may be configured to form the vacant space 94 between the upper word line 40 and the lower word line 30 while removing the first sacrificial layer 60 and the second sacrificial layer 70 in the horizontal direction.

Figure 18A:
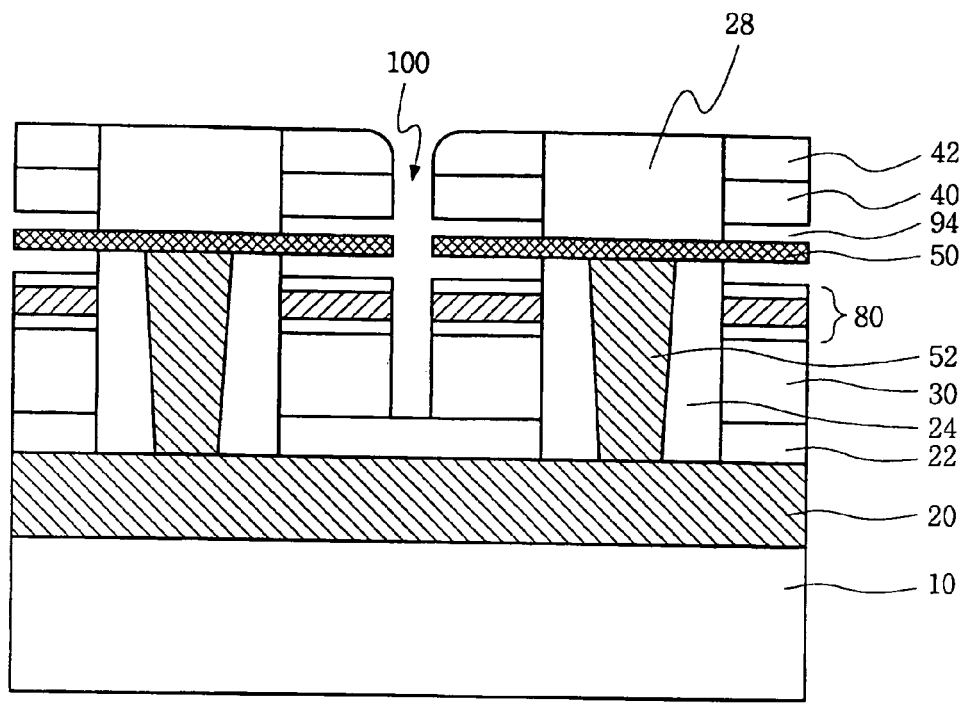
Figure 18B:
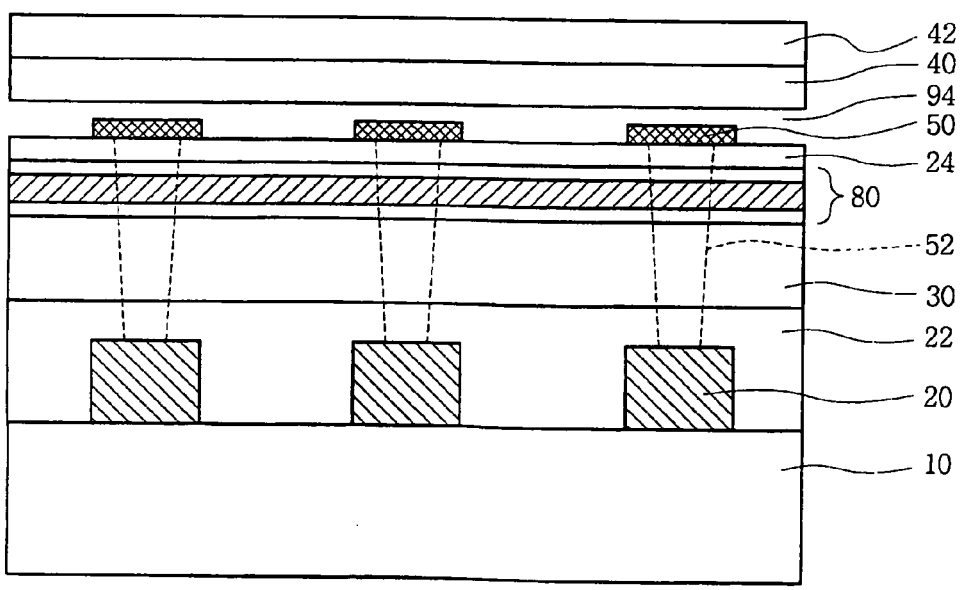

As illustrated in FIGS. 18A and 18B, the trench 100 exposing the first interlayer insulating layer 22, for example, at the bottom of the trench 100, may be formed by anisotropically etching the trap site 80 and the lower word line 30 in the second direction by the dry etching method using the third hard mask layer 42, the upper word line 40, and the cantilever electrode 50 on the vacant space as an etching mask. The trench 100 may be formed in the second direction so that the trap site 80 and the lower word line 30 may be respectively separated in the first direction under the cantilever electrode 50 with the node being separated. The first interlayer insulating layer 22 may be used as an etch stop layer to form the trench 100 which separates the trap site 80 and lower word line 30 by the dry etching method. The dummy trench 101, the vacant space 94, and/or the trench 100 may be formed by an in-situ process, using the anisotropic and isotropic dry etching methods in a single etching chamber.

Although not illustrated, a fourth interlayer insulating layer 110 covering the top end of the trench 100 may be formed to seal the inside of the trench 100. The vacant space 94 inside the trench 100 may be filled with a non-reaction gas, for example, nitrogen or argon, or the vacant space 94 may be a vacuum to increase the bending speed of the cantilever electrode 50. For example, the fourth interlayer insulating layer 110 may not be introduced into the trench 100 and/or may be formed of a polymer material which covers the top of the third interlayer insulating layer 28 or upper word line 40 on the top end of the trench 100. Another bit line 20, another lower word line 30, another cantilever electrode 50, and/or another upper word line 40 may be formed, for example, sequentially formed, on the top end of the substrate 10 on which the fourth interlayer insulating layer 110 is formed, thereby fabricating a memory device in a multi-layer structure.

Therefore, because a method of fabricating a multi-bit electro-mechanical memory device according to example embodiments may symmetrically form a plurality of lower word lines 30, a plurality of trap sites 80, a plurality of cantilever electrodes 50, and/or a plurality of upper word lines 40 using the trench 100 formed on the bit lines 20 in the second direction crossing the bit lines 20 formed on the substrate 10 in the first direction, the integration density of the memory device may be improved.

As described above, in a multi-bit electro-mechanical memory device and/or a method of fabricating the same according to example embodiments, the first and second lower word lines may be formed in the second direction crossing the bit lines formed in the first direction, and/or the cantilever electrode may be formed in the first direction which is the same direction as the direction of the bit lines, thereby enabling the multi-bit electro-mechanical memory device to include a matrix-shaped cell array. Therefore, the integration density of the memory device may be increased.

The multi-bit electro-mechanical memory device may have a structure stacking the first and second lower word lines and the first and second trap sites to bend the first and second cantilever electrodes in the third direction and to maintain the cantilever electrodes in the bent position. Therefore, the length of each of the first and second cantilever electrodes may be shortened as compared to a conventional memory device, and/or a part of each of the first and second cantilever electrodes which may be electrically contacted and pulled need not be individually manufactured. Therefore, the integration density of the memory device may be increased.

The first and second cantilever electrodes may be individually switched. Therefore, 2-bit or more data per unit cell may be input or output.

Although example embodiments have been shown and described in this specification and figures, it would be appreciated by those skilled in the art that changes may be made to the illustrated and/or described example embodiments without departing from their principles and spirit.

What is claimed is:

1. A method of fabricating a memory device, the method comprising:
    forming a bit line on a substrate in a first direction;
    forming a stack including a first interlayer insulating layer, a lower word line, a trap site and a first sacrificial layer in a second direction crossing the bit line;
    forming a second interlayer insulating layer to fill sidewalls of the stack and including a contact hole to expose the bit line at the sidewalls of the stack;
    forming a pad electrode inside the contact hole;
    forming a cantilever electrode on the pad electrode and the second interlayer insulating layer in the first direction, to be connected to the top of the first sacrificial layer;
    forming a second sacrificial layer and an upper word line on the cantilever electrode and the second interlayer insulating layer formed on the stack in the second direction;
    forming a third interlayer insulating layer around sidewalls of the second sacrificial layer and the upper word line;
    forming a trench to expose the first interlayer insulating layer at the bottom, by removing the upper word line, the second sacrificial layer, the cantilever electrode, the first sacrificial layer, the trap site and the lower word line in the second direction; and
    forming a space above and under the cantilever electrode, by removing the first sacrificial layer and the second sacrificial layer exposed by the trench.

2. The method of claim 1, further comprising:
    forming a spacer at the sidewalls of the stack before forming the second interlayer insulating layer.

3. The method of claim 1, wherein the contact hole is formed in the second interlayer insulating layer for selectively exposing the bit line at both sides of the stack by forming a silicon oxide layer to fill the sidewalls the stack and removing at least a portion of the silicon oxide layer to expose the first sacrificial layer.

4. The method of claim 1, wherein the pad electrode is formed by filling the contact hole with at least one of conductive metal and polysilicon, and removing the at least one of conductive metal and polysilicon to expose the first sacrificial layer and the second interlayer insulating layer.

5. The method of claim 1, wherein the cantilever electrode is formed on the bit line with a critical dimension substantially the same as a critical dimension of the bit line.

6. The method of claim 1, wherein if the first and second sacrificial layers are formed of polysilicon materials, the polysilicon materials are isotropically etched to be removed by at least one of a wet etching method and a dry etching method.

7. The method of claim 6, wherein an isotropic etching solution used for the wet etching method includes a mixed solution including a nitric acid, a fluoric acid, and an acetic acid mixed with deionized water at a concentration, and an isotropic reaction gas used for the dry etching method includes a carbon fluoride series gas.

8. The method of claim 1, further comprising:
removing a portion of the upper word line, a portion of the second sacrificial layer, a portion of the cantilever electrode, and a portion of the first sacrificial layer to form a dummy trench exposing the trap site and sidewalls of the first sacrificial layer and the second sacrificial layer;
removing at least a portion of the first sacrificial layer and at least a portion of the second sacrificial layer to form the space above and below the cantilever electrode; and
removing a portion of the trap site and a portion of the lower word line exposed at the bottom of the dummy trench to form the trench exposing the first interlayer insulating layer.

9. The method of claim 1, further comprising:
forming a fourth interlayer insulating layer on a top portion of the trench to seal the inside of the trench.

* * * * *